(12) United States Patent
Kura

(10) Patent No.: US 10,468,583 B2
(45) Date of Patent: Nov. 5, 2019

(54) PIEZOELECTRIC ACTUATOR AND LIQUID EJECTION DEVICE

(71) Applicant: BROTHER KOGYO KABUSHIKI KAISHA, Nagoya-shi, Aichi-ken (JP)

(72) Inventor: Keiji Kura, Chita (JP)

(73) Assignee: BROTHER KOGYO KABUSHIKI KAISHA, Nagoya-shi, Aichi-ken (JP)

( * ) Notice: Subject to any disclaimer, the term of this patent is extended or adjusted under 35 U.S.C. 154(b) by 4 days.

(21) Appl. No.: 15/881,850

(22) Filed: Jan. 29, 2018

(65) Prior Publication Data
US 2018/0264815 A1   Sep. 20, 2018

(30) Foreign Application Priority Data
Mar. 17, 2017  (JP) .................................. 2017-053073

(51) Int. Cl.
*B41J 2/14*   (2006.01)
*H01L 41/047*   (2006.01)
*H01L 41/09*   (2006.01)

(52) U.S. Cl.
CPC ...... *H01L 41/0471* (2013.01); *H01L 41/0973* (2013.01)

(58) Field of Classification Search
CPC  B41J 2/14209; B41J 2/14233; B41J 2202/18; B41J 2002/14459; B41J 2002/14266; B41J 2002/14258; B41J 2002/14491; H01L 41/0471; H01L 41/0973
See application file for complete search history.

(56) References Cited

FOREIGN PATENT DOCUMENTS

| JP | 2011-212865 | * 10/2011 | .............. B41J 2/045 |
| JP | 2011-212865 A | 10/2011 | |

* cited by examiner

*Primary Examiner* — Henok D Legesse
(74) *Attorney, Agent, or Firm* — Scully, Scott, Murphy & Presser, P.C.

(57) ABSTRACT

A piezoelectric actuator includes a first piezoelectric layer, a second piezoelectric layer, individual electrodes, a first conductor and an auxiliary electrode. The first piezoelectric layer and the second piezoelectric layer are joined to each other at a surface of the first piezoelectric layer. The individual electrodes are disposed on the first piezoelectric layer. The first conductor is spaced apart from the individual electrodes in a direction orthogonal to the surface of the first piezoelectric layer. The first conductor includes electrode portions and a connecting portion. The electrode portions each overlap a first portion of a corresponding one of the individual electrodes. The connecting portion connects at least two of the electrode portions to each other. The auxiliary electrode is connected to the connecting portion, overlaps the connecting portion, and is spaced apart from the first conductor in the direction.

27 Claims, 16 Drawing Sheets

SCANNING DIRECTION
LEFT ⟷ RIGHT
CONVEYING DIRECTION ↓

SCANNING DIRECTION
LEFT ⟷ RIGHT

CONVEYING DIRECTION ↓

TOP-BOTTOM DIRECTION

LEFT ⟷ RIGHT
SCANNING DIRECTION

SCANNING DIRECTION
LEFT ⟷ RIGHT

CONVEYING DIRECTION ↓

SCANNING DIRECTION
LEFT ↔ RIGHT
CONVEYING DIRECTION ↓

SCANNING DIRECTION
LEFT ⟷ RIGHT

CONVEYING DIRECTION ↓

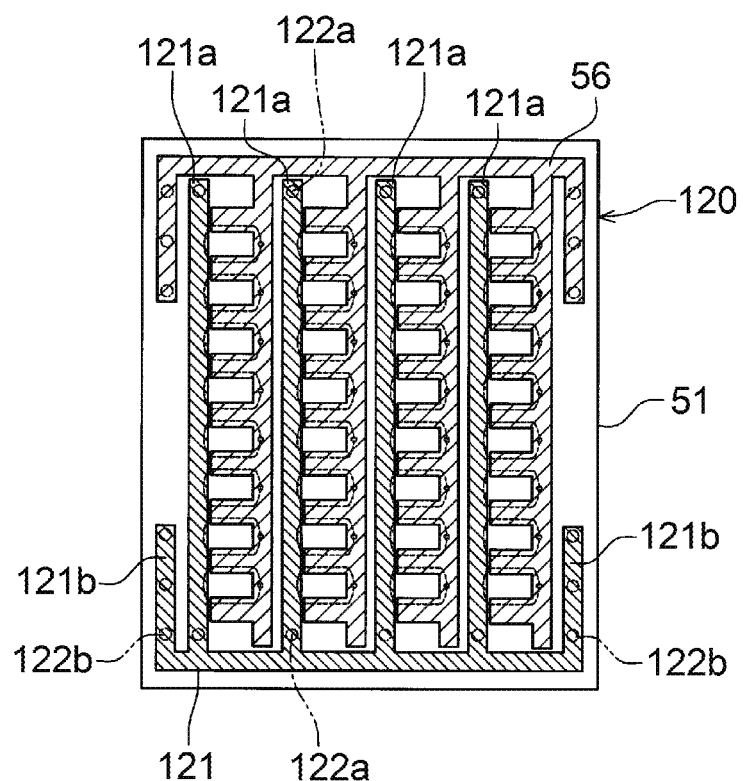

PIEZOELECTRIC ACTUATOR AND LIQUID EJECTION DEVICE

CROSS-REFERENCE TO RELATED APPLICATION

This application claims priority from Japanese Patent Application No. 2017-053073 filed on Mar. 17, 2017, the content of which is incorporated herein by reference in its entirety.

FIELD OF DISCLOSURE

Aspects disclosed herein relate to a piezoelectric actuator and a liquid ejection device including the piezoelectric actuator.

BACKGROUND

For example, a known piezoelectric actuator includes three piezoelectric layers stacked one above another. The piezoelectric actuator further includes first conductors, second conductors, and individual electrodes. The first conductors are disposed between the middle piezoelectric layer and the lowest piezoelectric layer. The second conductors are disposed between the top piezoelectric layer and the middle piezoelectric layer. The individual electrodes are disposed on an upper surface of the top piezoelectric layer. One each of the first conductors, the second conductors, and the individual electrodes are provided for each of a plurality of pressure chambers. Each of the first conductors overlaps, in a top-bottom direction, confronting end portions of adjacent pressure chambers in a sheet feeding direction. The first conductors are connected to each other by a first common wiring and are maintained at a ground potential. Each of the second conductors overlaps a central portion of a corresponding one of the pressure chambers in the top-bottom direction. The second conductors are connected to each other by a second common wiring and are maintained at a predetermined driving potential. The individual electrodes are provided for the pressure chambers correspondingly while each of the individual electrodes extends substantially throughout a length and width of a corresponding pressure chamber. Each of the individual electrodes overlaps, in the top-bottom direction, a corresponding one of the first conductors and a corresponding one of the second conductors. Each of the individual electrodes may be applied with one of the ground potential and the driving potential.

SUMMARY

In response to activation of the piezoelectric actuator due to change of potential that is being applied to a target individual electrode between the ground potential and the driving potential, current flows through corresponding each of the first and second conductors. In the known piezoelectric actuator, a distance between an individual electrode and its corresponding second conductor is shorter than a distance between the individual electrode and its corresponding first conductor. Therefore, capacitance of the individual electrode, the second conductor, and a portion of the piezoelectric layer sandwiched between the individual electrode and the second conductor is greater than capacitance of the individual electrode, the first conductor, and a portion of each of the piezoelectric layers sandwiched between the individual electrode and the first conductor. Therefore, when the piezoelectric actuator becomes activated, more current flows through the second conductor than the first conductor. When current flows through the second conductor, charge is applied to the first conductor from the second common wiring. Nevertheless, if an area of the second common wiring is relatively small, a charge application timing may be delayed as compared with a predetermined charge application timing. This may thus cause variation in activation characteristic of the piezoelectric actuator. In order to overcome such a problem, it may be conceivable that the area of the second common wiring is increased. Nevertheless, this increase may cause increase in size of the piezoelectric actuator in a surface-extending direction correspondingly.

Accordingly, some embodiments of the disclosure provide for a piezoelectric actuator that may avoid increase in size itself and may eliminate or reduce delay of charge application to target electrode portions, and a liquid ejection device including the piezoelectric actuator.

According to an aspect of the disclosure, a piezoelectric actuator includes a first piezoelectric layer, a second piezoelectric layer, individual electrodes, a first conductor and an auxiliary electrode. The first piezoelectric layer and the second piezoelectric layer are joined to each other at a surface of the first piezoelectric layer. The individual electrodes are disposed on the first piezoelectric layer. The first conductor is spaced apart from the individual electrodes in a direction orthogonal to the surface of the first piezoelectric layer. The first conductor includes electrode portions and a connecting portion. The electrode portions each overlap a first portion of a corresponding one of the individual electrodes. The connecting portion connects at least two of the electrode portions to each other. The auxiliary electrode is connected to the connecting portion, overlaps the connecting portion, and is spaced apart from the first conductor in the direction.

BRIEF DESCRIPTION OF THE DRAWINGS

Aspects of the disclosure are illustrated by way of example and not by limitation in the accompanying figures in which like reference characters indicate similar elements.

FIG. 15 illustrates an upper surface of an insulating layer of a piezoelectric actuator in a second variation according to one or more aspects of the disclosure.

DETAILED DESCRIPTION

First Illustrative Embodiment

A first illustrative embodiment will be described with reference to appropriate accompanying drawings.

<Overall Configuration of Printer>

Figure 1:
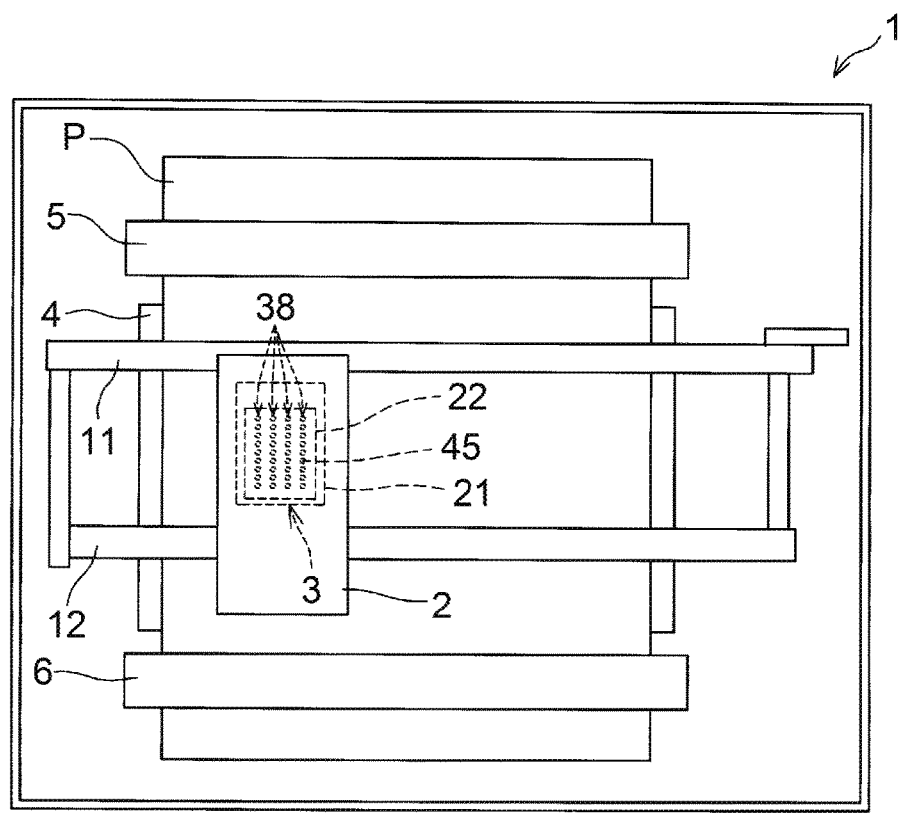
FIG. 1 is a schematic diagram illustrating a configuration of a printer in a first illustrative embodiment according to one or more aspects of the disclosure.

As illustrated in FIG. 1, a printer 1 includes a carriage 2, an inkjet head 3 (which is an example of a liquid ejecting device), a platen 4, and conveying rollers 5 and 6.

The carriage 2 is supported by a plurality of, for example, two guide rails 11 and 12 that extend in a scanning direction. The carriage 2 is configured to reciprocate in the scanning direction along the guide rails 11 and 12. As illustrated in FIG. 1, the scanning direction may be bidirectional and one direction of the scanning direction may be defined as the right and the other direction of the scanning direction may be defined as the left. The inkjet head 3 is mounted on the carriage 2, and has a plurality of nozzles 45 in its lower surface. The inkjet head 3 is configured to eject ink from the nozzles 45. The platen 4 is disposed below the inkjet head 3, and is configured to support a recording sheet P from below. The conveying rollers 5 and 6 are disposed upstream and downstream, respectively, from the platen 4 in a convening direction (which is an example of an arrangement direction) orthogonal to the scanning direction. The conveying rollers 5 and 6 are configured to convey a recording sheet P in the conveying direction.

In printing on a recording sheet P performed by the printer 1, the conveying rollers 5 and 6 convey the recording sheet P by a predetermined distance intermittently. In accordance with a sheet conveyance, the printer 1 drives the inkjet head 3 to eject ink from appropriate ones of the nozzles 45 while moving the carriage 2 along the scanning direction.

<Inkjet Head>

Hereinafter, the inkjet head 3 will be described in detail. As illustrated in FIGS. 2 to 7, the inkjet head 3 includes a channel unit 21 and a piezoelectric actuator 22. The channel unit 21 has a laminated structure including a plurality of, for example, seven, plates 31 to 37. The channel unit 21 has a plurality of individual ink channels, each of which includes a manifold channel 41, a narrowed channel 42, a pressure chamber 40, a descending channel 44, and a nozzle 45.

Figure 2:
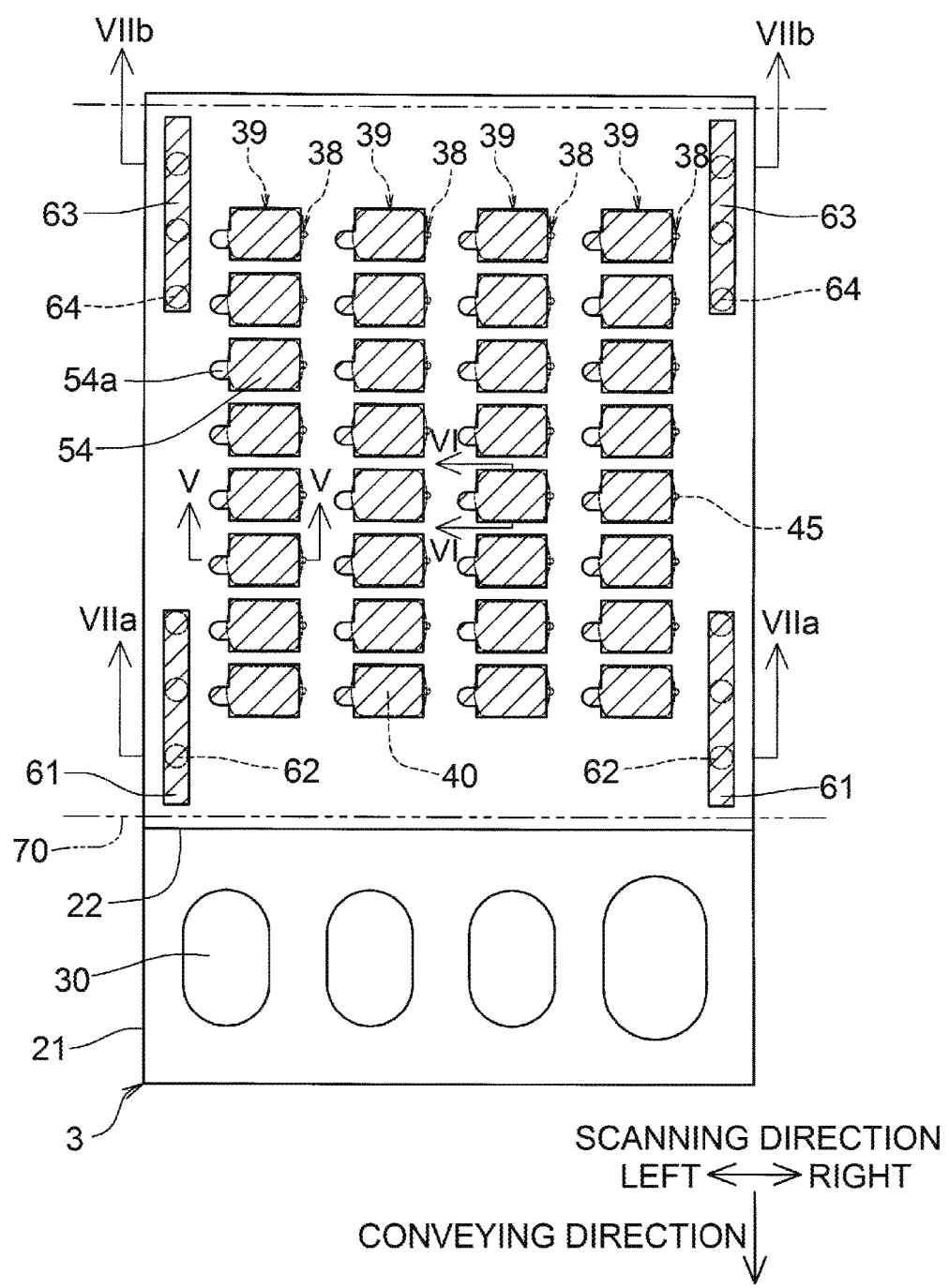
FIG. 2 is a plan view of an inkjet head of FIG. 1 in the first illustrative embodiment according to one or more aspects of the disclosure.

Each of the pressure chambers 40 has a substantially oval shape elongated in the scanning direction in FIG. 2. The pressure chambers 40 are aligned in a plurality of rows extending along the conveying direction and constitute a plurality of pressure chamber rows 39. In the first illustrative embodiment, the inkjet head 3 includes, for example, four, pressure chamber rows 39 next to each other with respect to the scanning direction. The nozzles 45 constitute a plurality of nozzle rows 38 corresponding to the four pressure-chamber rows 39, respectively. The nozzles 45 in the rightmost nozzle row 38 are configured to eject black ink. The nozzles 45 in the nozzle row 38 to the left next to the black nozzle row 38 are configured to eject yellow ink, the nozzles 45 in the nozzle row 38 to the left next to the yellow nozzle row 38 are configured to eject cyan ink, and the nozzles 45 in the nozzle row 38 to the left next to the cyan nozzle row 38 are configured to eject magenta ink. Each of the individual ink channels defined in the channel unit 21 has the same or similar structure to a known one, and therefore, a detailed description of the individual channels will be omitted.

The piezoelectric actuator 22 is disposed on an upper surface of the channel unit 21 with covering the pressure chambers 40. The piezoelectric actuator 22 includes a first piezoelectric layer 51, a second piezoelectric layer 52, an insulating layer 53, a plurality of individual electrodes 54, a first conductor 55, a second conductor 56, and a plurality of, for example, four, auxiliary electrodes 57. The first piezoelectric layer 51 may be made of piezoelectric material mainly containing, for example, lead zirconate titanate which is a mixed crystal of lead titanate and lead zirconate. The second piezoelectric layer 52 may be made of the same or similar piezoelectric material as the first piezoelectric layer 51. The second piezoelectric layer 52 is joined to a lower surface of the first piezoelectric layer 51. The insulating layer 53 may be made of insulating material, e.g., piezoelectric material or synthetic resin material. The insulating layer 53 is joined to a lower surface of the second piezoelectric layer 52. The insulating layer 53 may function as a vibration film. A lamination of the first piezoelectric layer 51, the second piezoelectric layer 51, and the insulating layer 53 corresponds to a laminated member.

Figure 3A:
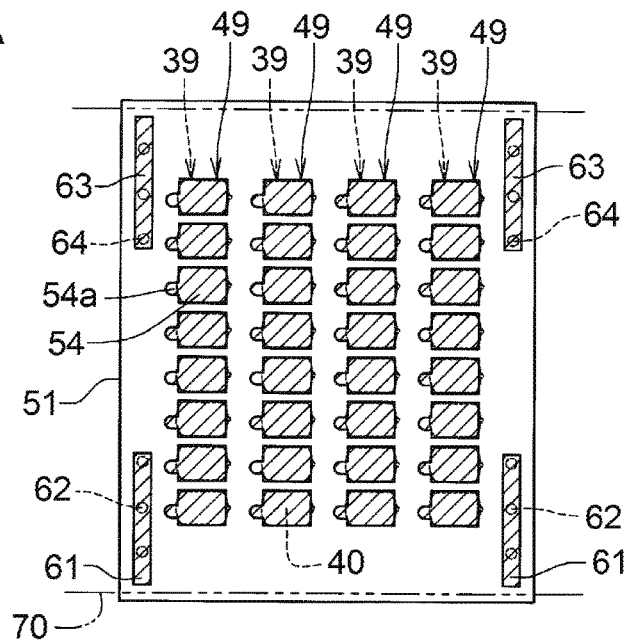
FIG. 3A illustrates an upper surface of a first piezoelectric layer of a piezoelectric actuator in the first illustrative embodiment according to one or more aspects of the disclosure.
Figure 5:
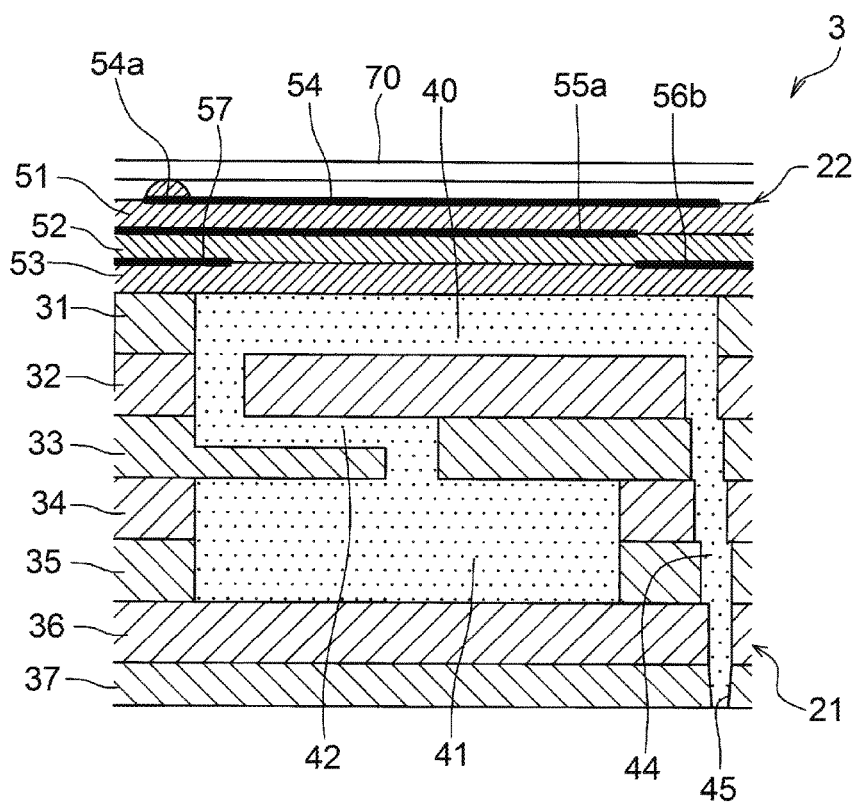
FIG. 5 is a sectional view taken along line V-V of FIG. 2 in the first illustrative embodiment according to one or more aspects of the disclosure.
Figure 6:
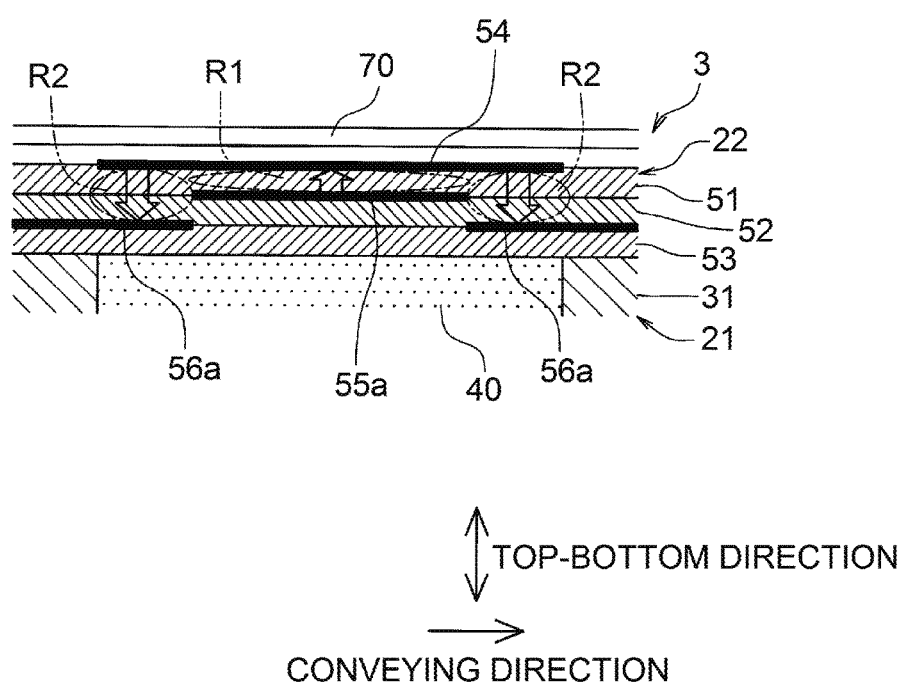
FIG. 6 is a sectional view taken along line VI-VI of FIG. 2 in the first illustrative embodiment according to one or more aspects of the disclosure.

As illustrated in FIGS. 3A, 5, and 6, the individual electrodes 54 are disposed on an upper surface of the first piezoelectric layer 51 (i.e., on the other surface, which does not face the second piezoelectric layer 52, of the first piezoelectric layer 51). The individual electrodes 54 correspond one-to-one to the pressure chambers 40. Each of the individual electrodes 54 overlaps a substantially entire portion of a corresponding one of the pressure chambers 40. That is, the individual electrodes 54 are aligned in four rows along the conveying direction and constitute four individual electrode rows 49 on the upper surface of the first piezoelectric layer 51. The individual electrode rows 49 are next to each other in the scanning direction. Each of the individual electrodes 54 includes a contact 54a that extends from a left end of a corresponding individual electrode 54. The contact 54a does not overlap any portion of a corresponding pressure chamber 40 in a top-bottom direction.

Figure 3B:
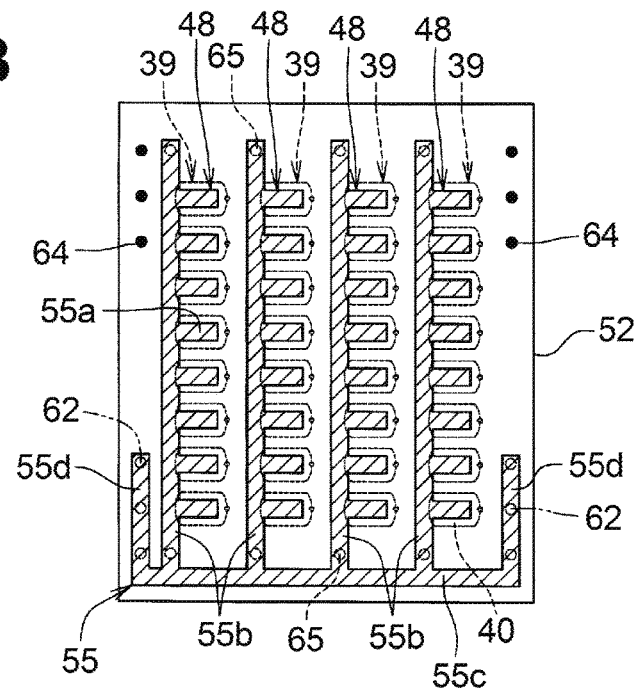
FIG. 3B illustrates an upper surface of a second piezoelectric layer of the piezoelectric actuator in the first illustrative embodiment according to one or more aspects of the disclosure.

As illustrated in FIGS. 3B, 5, and 6, the first conductor 55 is disposed between the first piezoelectric layer 51 and the second piezoelectric layer 52. The first conductor 55 includes a plurality of electrode portions 55a, a plurality of, for example, four, first connecting portions 55b, and a second connecting portion 55c. The electrode portions 55a correspond one-to-one to the pressure chambers 40. Each of the electrode portions 55a overlaps a central portion of a corresponding one of the pressure chambers 40. Therefore, each of the electrode portions 55a overlaps a central portion (which is an example of a first portion) of a corresponding one of the individual electrodes 54 in the conveying direction. That is, the electrode portions 55a are aligned in four rows along the conveying direction and constitute four electrode portion rows 48 between the first piezoelectric layer 51 and the second piezoelectric layer 52 in the top-bottom direction. The electrode portion rows 48 are next to each other in the scanning direction.

Figure 7A:
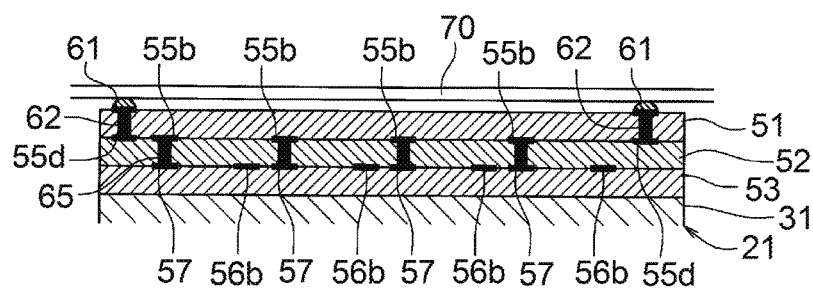
FIG. 7A is a sectional view taken along line VIIa-VIIa of FIG. 2 in the first illustrative embodiment according to one or more aspects of the disclosure.
Figure 7B:
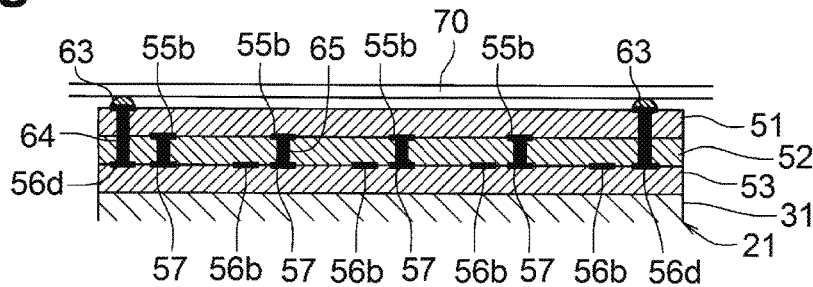
FIG. 7B is a sectional view taken along line VIIb-VIIb of FIG. 2 in the first illustrative embodiment according to one or more aspects of the disclosure.

The first connecting portions 55b correspond one-to-one to the electrode portion rows 48. Each of the first connecting portions 55b extends in the conveying direction, and connect between left ends of the electrode portions 55a of a corresponding electrode portion row 48. The second connecting portion 55c extends in the scanning direction, and connects between downstream ends of the first connecting portions 55b in the conveying direction. The second connecting portion 55c includes an extended portion 55d at each end in the scanning direction. The extended portions 55d extend upstream in the conveying direction from the respective ends of the second connecting portion 55c. As illustrated in FIGS. 3A, 3B, and 7A, the first piezoelectric layer 51 has a plurality of, for example, six, second through holes 62. More specifically, for example, three each of the second through holes 62 are defined at each of the end portions (e.g., the right and left end portions) of the first piezoelectric layer 51 in the scanning direction and aligned along the conveying direction. At each of the end portions of the first piezoelectric layer 51 in the scanning direction, a surface electrode 61 is disposed on the upper surface of the first piezoelectric layer 51 with overlapping a corresponding one of the extended portions 55d, and the second through holes 62 are positioned between the extended portion 55d and the surface electrode 61 that overlap each other in the top-bottom direction. Therefore, at each of the end portions of the first piezoelectric layer 51 in the scanning direction, the second through holes 62 enable the extended portion 55d to extend to the upper surface of the first piezoelectric layer 51 to connect with the surface electrode 61.

Figure 4:
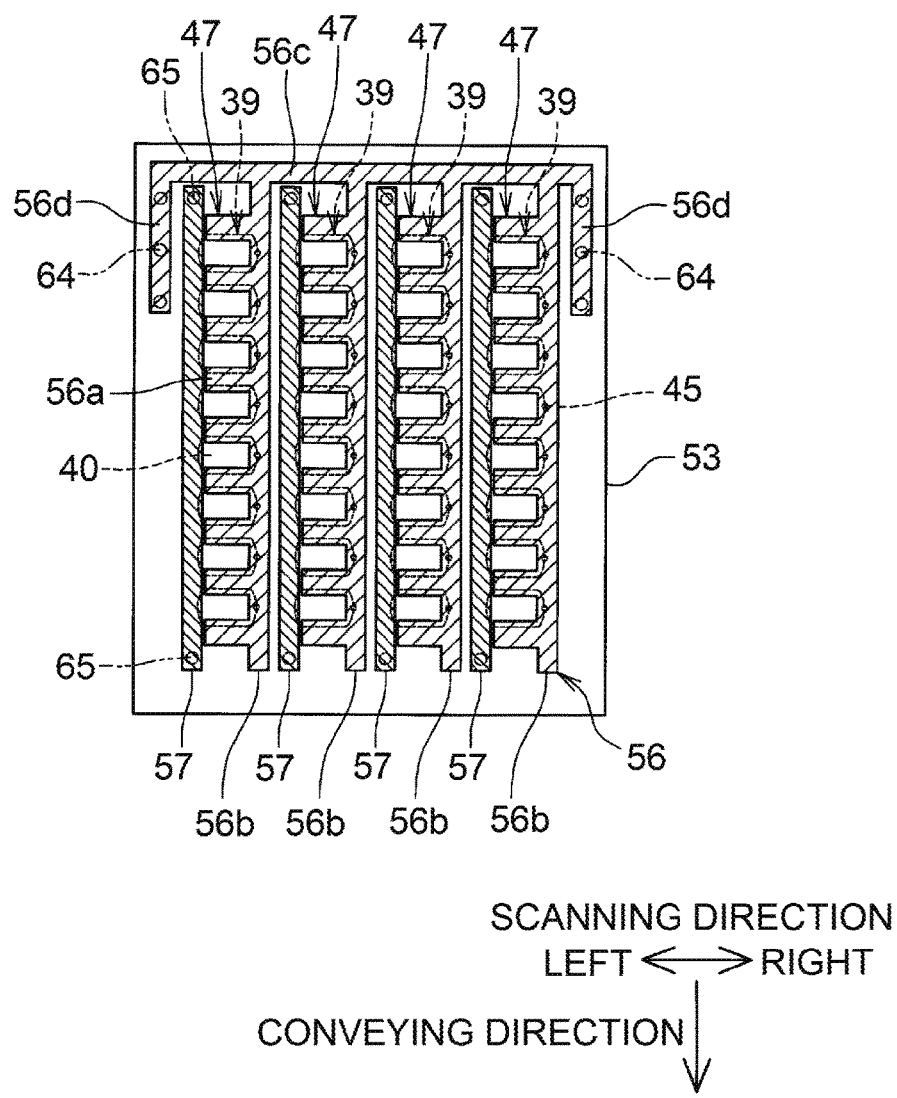
FIG. 4 illustrates an upper surface of an insulating layer of the piezoelectric actuator in the first illustrative embodiment according to one or more aspects of the disclosure.

As illustrated in FIGS. 4, 5, and 6, the second conductor 56 is disposed between the second piezoelectric layer 52 and the insulating layer 53 (e.g., the second piezoelectric layer 52 on the lower surface, which does not face the first piezoelectric layer 51). The second conductor 56 includes a plurality of electrode portions 56a, a plurality of, for example, four, third connecting portions 56b, and a fourth connecting portion 56c. The electrode portions 56a are provided for the pressure chambers 40. Each of the electrode portions 56a overlaps both end portions of corresponding adjacent pressure chambers 40 in the conveying direction. Therefore, each of the electrode portions 56a overlaps confronting end portions (each of which is an example of a second portion) of corresponding adjacent individual electrodes 54 in the conveying direction. That is, the electrode portions 56a are aligned in four rows along the conveying direction and constitute four electrode portion rows 47. The electrode portion rows 47 are disposed between the second piezoelectric layer 52 and the insulating layer 53 in the top-bottom direction and next to each other in the scanning direction.

The third connecting portions 56b correspond one-to-one to the electrode portion rows 47. Each of the third connecting portions 55b extends in the conveying direction, and connect between right ends of the electrode portions 56a of a corresponding electrode portion row 47. The fourth connecting portion 56c extends in the scanning direction, and connects between upstream ends of the third connecting portions 56b in the conveying direction. The fourth connecting portion 56c includes an extended portion 56d at each end in the scanning direction. The extended portions 56d extend downstream in the conveying direction from the respective ends of the fourth connecting portion 56c. As illustrated in FIGS. 3A, 3B, 4, and 7B, the first piezoelectric layer 51 has a plurality of, for example, six, through holes 64. More specifically, for example, three each of the through holes 64 are defined at each of the end portions (e.g., the right and left end portions) of the first piezoelectric layer, 51 in the scanning direction and aligned along the conveying direction. At each of the end portions of the first piezoelectric layer 51 in the scanning direction, a surface electrode 63 is disposed on the upper surface of the first piezoelectric layer 51 with overlapping a corresponding one of the extended portions 56d, and the through holes 64 are positioned between the extended portion 56d and the surface electrode 63 that face each other in the top-bottom direction. Therefore, at each of the end portions of the first piezoelectric layer 51 in the scanning direction, the through holes 64 enable the extended portion 56d to extend to the upper surface of the first piezoelectric layer 51 to connect with the surface electrode 63.

As illustrated in FIGS. 4 and 5, the auxiliary electrodes 57 are disposed between the second piezoelectric layer 52 and the insulating layer 53. That is, in the first illustrative embodiment, the auxiliary electrodes 57 are located on the same surface as the second conductor 56. The auxiliary electrodes 57 correspond one-to-one to the first connecting portions 55b of the first conductor 55. The auxiliary electrodes 57 extend along the conveying direction and overlap the respective first connecting portions 55b in the top-bottom direction. The auxiliary electrodes 57 have substantially the same shape as the respective corresponding first connecting portions 55b in plan view. The auxiliary electrodes 57 substantially entirely overlap the respective first connecting portions 55b in the top-bottom direction. As illustrated in FIG. 3B, in the first conductor 55, the electrode portions 55a extend from their corresponding first connecting portions 55b. Each boundary between one of the electrode portions 55a and its corresponding first connecting portion 55b overlaps, in the top-bottom direction, a left end portion of a corresponding pressure chamber 40 in the scanning direction. That is, each of the pressure chambers 40 has an overlapping portion (e.g., the left end portion) that overlaps a corresponding first connection portion 55b. Thus, as illustrated in FIG. 4, each of the auxiliary electrodes 57 overlaps the overlapping portions of the corresponding pressure chambers 40 in the top-bottom direction. Nevertheless, the auxiliary electrodes 57 do not overlap any portion of the electrode portions 55a.

As illustrated in FIGS. 3B, 4, 7A and 7B, the second piezoelectric layer 52 has a plurality of first through holes 65. The first through holes 65 are positioned such that one each of the first through holes 65 overlaps each end portion of a corresponding one of the auxiliary electrodes 57 in the conveying direction. Therefore, the first through holes 65 enable the both end portions of the auxiliary electrodes 57 in the conveying direction to extend to the upper surface of the second piezoelectric layer 52 to connect with the respective first connecting portions 55b.

As illustrated in FIG. 6, the piezoelectric actuator 22 has particular portions, each of which is sandwiched between one of the individual electrodes 54 and a corresponding one of the electrode portions 55a and is defined within the first piezoelectric layer 51. Each of the particular portions defined within the first piezoelectric layer 51 of the piezoelectric actuator 22 functions as an active portion R1, which is polarized in a direction from a corresponding electrode portion 55a toward its corresponding individual electrode 54 (hereinafter, as a first polarization direction). The piezoelectric actuator 22 has other particular portions, each of which is sandwiched between one of the individual electrodes 54 and a corresponding one of the electrode portions 56a and defined within the first and second piezoelectric layers 51 and 52. Each of the particular portions defined within the first and second piezoelectric layers 51 and 52 of the piezoelectric actuator 22 functions as an active portion R2, which is polarized in a direction from an individual electrode 54 toward its corresponding electrode portion 56a (hereinafter, as a second polarization direction).

In the first illustrative embodiment, the individual electrodes 54, the first conductor 55, the second conductor 56, and the auxiliary electrodes 57 have substantially equal thickness.

A chip-on-film ("COF") 70 is joined to the upper surface of the piezoelectric actuator 22. The surface electrodes 61 and 63 are connected to a power source (not illustrated) via wirings (not illustrated) of the COF 70. The surface electrodes 61 and the first conductor 55 are maintained at a driving potential of, for example, 20V (which is an example of a first potential). The surface electrodes 63 and the second conductor 56 are maintained at a ground potential (which is an example of a second potential). The COF 70 includes a driver IC (not illustrated) mounted thereon. The contacts 54a are connected to the driver IC via the wirings of the COF 70. This configuration may enable the potential of each of the individual electrodes 54 to be changed between the driving potential and the ground potential individually by the driver IC.

Hereinafter, a description will be made on how the piezoelectric actuator 22 behaves. In the piezoelectric actuator 22, the first conductor 55 is maintained at the driving potential and the second conductor 56 is maintained at the ground potential. While the printer 1 is in a standby state (e.g., when the printer 1 is not performing printing), all of the individual electrodes 54 are maintained at the ground potential.

Under this circumstances, an electric field occurs at each active portion R1 due to a potential difference between a corresponding individual electrode 54 and a corresponding electrode portion 55a. The electric field is directed in the same direction as the first polarization direction of the active portion R1. With the occurrence of the electric field, each active portion R1 contracts in its surface-extending direction orthogonal to the direction in which the electric field is directed. Thus, in each of the first piezoelectric layer 51, the second piezoelectric layer 52, and the insulating layer 53, a portion, which overlaps a corresponding one of the pressure chambers 40, deforms to protrude toward the corresponding pressure chamber 40. In the state where those portions have deformed, the volume of each pressure chamber 40 has become less than that in a state where those portions has not deformed or in their natural state.

For ejecting ink from a particular nozzle 45, the potential of an individual electrode 54 corresponding to the nozzle 45 is changed to the driving potential temporarily. Upon lapse of a predetermined period, the potential of the individual electrode 54 corresponding to the nozzle 45 is returned to the ground potential. With the change of the potential of the individual electrode 54 to the driving potential from the ground potential, the potential of the individual electrode 54 becomes the same as the potential of the first conductor 55. Therefore, an active portion R1 corresponding to the individual electrode 54 expands to become another state which may be a state before the active portion R1 contracts. Further, another electric field occurs at each active portion R2 corresponding to the individual electrode 54 due to a potential difference between the corresponding individual electrode 54 and each corresponding electrode portion 56a. The electric field is directed in the same direction as the second polarization direction of the active portions R2. With the occurrence of the electric field, each active portion R2 contracts in its surface-extending direction. Thus, in each of the first piezoelectric layer 51, the second piezoelectric layer 52, and the insulating layer 53, a portion, which overlaps a pressure chamber 40 corresponding to the particular nozzle 45, deforms toward a direction away from the pressure chamber 40 to increase the volume of the pressure chamber 40. At that time, ink pressure in the pressure chamber 40 becomes lower to cause ink to flow into the pressure chamber 40 from the manifold channel 41 via the narrowed channel 42.

Thereafter, in response to change of the potential of the individual electrode 54 from the driving potential to the ground potential again, the potential of the individual electrode 54 becomes the same as the potential of the second conductor 56. Therefore, each active portion R2 corresponding to the individual electrode 54 expands in its surface-extending direction to become another state which may be a state before the active portions R2 contract. With the potential difference between the individual electrode 54 and the first conductor 55, the active portion R1 contracts in its surface-extending direction. Thus, in each of the first piezoelectric layer 51, the second piezoelectric layer 52, and the insulating layer 53, the portion, which overlaps the pressure chamber 40, deforms to protrude toward the pressure chamber 40 to decrease the volume of the pressure chamber 40. Therefore, ink pressure in the pressure chamber 40 becomes higher to cause ink to be ejected from the particular nozzle 45 communicating with the pressure chamber 40.

In a case where the piezoelectric actuator 22 is activated in such a manner, when the potential of the individual electrode 54 is changed from the ground potential to the driving potential, the expansion of the active portion R1 and the contract of each active portion R2 absorb each other. In addition, when the potential of the individual electrode 54 is changed from the driving potential to the ground potential, the contract of the active portion R1 and the expansion of each active portion R2 absorb each other. Such an action may therefore reduce or avoid an occurrence of crosstalk, which is a phenomenon that deformation of one portion, which overlaps a certain pressure chamber 40, of each of the first piezoelectric layer 51, the second piezoelectric layer 52, and the insulating layer 53, is transferred to another portion, which overlaps another pressure chamber 40, of each of those layers 51 to 53 to affect deformation of the other portion.

When the potential of the particular individual electrode 54 is changed from the ground potential to the driving potential or from the driving potential to the ground potential in order to activate the piezoelectric actuator 22, current flows through the electrode portions 55a and 56a corresponding to the particular individual electrode 54. At that time, charge is applied to the electrode portion 55a from a corresponding first connecting portion 55b and also to the electrode portion 56a from a corresponding third connecting portion 56b. In the first illustrative embodiment, a distance between an individual electrode 54 and its corresponding electrode portion 55a is shorter than a distance between the same individual electrode 54 and its corresponding electrode portion 56a. Therefore, capacitance of an active portion R1 is greater than capacitance of an active portion R2. Therefore, when the potential of the individual electrode 54 is changed, more current flows through the electrode portion 55a than current that flows through the electrode portion 56a, and more charge is applied to the electrode portion 55a from the first connecting portion 55b than charge that is applied to the electrode portion 56a from the third connecting portion 56b. Nevertheless, for example, when the potential of a large number of individual electrodes 54 are changed simultaneously for ejecting ink from particular corresponding nozzles 45 at the same time, charge application to one or more of the target electrode portions 55a from appropriate one of the first connecting portions 55b may lag behind charge application to the others of the target electrode portions 55a from appropriate one of the first connecting portions 55b (i.e., delay may occur when charge is applied to the target electrode portions 55a). Such a delay may further cause an ink ejection failure at one or more nozzles 45 corresponding to the electrode portions 55a to which charge application was delayed. In order to overcome such a problem, an area (i.e., a size) of each of the first connecting portions 55b may be increased to increase an amount of charge that can be applied to the electrode portions 55a from the first connecting portions 55b. Nevertheless, the increase of the area of each of the first connecting portions 55b may cause increase in size of the piezoelectric actuator 22 correspondingly.

In the first illustrative embodiment, the auxiliary electrodes 57 are provided overlapping the respective first connecting portions 55b, and the first connecting portions 55b have continuity to the respective auxiliary electrodes 57 via the corresponding first through holes 65. With this configuration, when current flows to each of the target electrode portions 55a, charge accumulated in a corresponding first connecting portion 55b and charge accumulated in its corresponding auxiliary electrode 57 are both applied to each of the target electrode portions 55a. This configuration may therefore enable to reduce or prevent delay of charge application to the target electrode portion 55a. Further, in the first illustrative embodiment, the auxiliary electrodes 57 overlap the respective first connecting portions 55b entirely, which may result in avoiding increase of the size of the piezoelectric actuator 22 in the scanning direction and in the conveying direction.

In the first illustrative embodiment, while the second connecting portion 55c connects between the downstream end portions of the first connecting portions 55b in the conveying direction, the auxiliary electrodes 57 are connected to the downstream end portions (e.g., the end portions connecting to the second connecting portion 55c) of the respective first connecting portions 55b in the conveying direction via the respective first through holes 65. This configuration may therefore enable the auxiliary electrodes 57 to be connected to the respective first connecting portions 55b at respective positions close to the second connecting portion 55c. Therefore, charge tends to be easily applied to the auxiliary electrodes 57 from the power source. Consequently, charge may be applied to a target electrode portion 55a from an appropriate one of the auxiliary electrode 57 effectively. This may therefore result in reducing or preventing delay of charge application to the target electrode portions 55a from the first connecting portions 55b effectively.

In the first illustrative embodiment, the auxiliary electrodes 57 are connected to the upstream end portions (e.g., the end portions which do not connect to the second connecting portion 55c) of the respective first connecting portions 55b in the conveying direction via the respective first through holes 65. This configuration may further improve the performance of charge application to the target electrode portion 55a from an appropriate one of the auxiliary electrode 57, which may result in reducing or preventing delay of charge application to the target electrode portions 55a further effectively.

In the first illustrative embodiment, the piezoelectric actuator 22 has the first through holes 65 at the particular respective positions in the insulating layer 53 such that each of the first through holes 65 is sandwiched between one of the first connecting portions 55b and its corresponding auxiliary electrode 57. This configuration may therefore enable the first connecting portions 55b and the respective corresponding auxiliary electrodes 57 to be connected to each other easily.

In the first illustrative embodiment, the first conductor 55 includes the four first connecting portions 55b, and the four auxiliary electrodes 57 are provided for the respective first connecting portions 55b correspondingly. This configuration may therefore enable to reduce or prevent delay of charge application to the target electrode portions 55a effectively. In the first illustrative embodiment, the extended portions 55d of the second connecting portion 55c are connected to the respective corresponding surface electrodes 61 via the second through holes 62. This configuration may however tend to cause delay of charge application to one or more of the electrode portions 55a extending from either two of the first connecting portions 55b located between the endmost first connecting portions 55b in the scanning direction. In light of such circumstances, providing the auxiliary electrodes 57 for particularly the two first connecting portions 55b located between the endmost first connecting portions 55b in the scanning direction may have a great effect on reducing or preventing delay of charge application to the target electrode portions 55a.

In the first illustrative embodiment, the second conductor 56 and the auxiliary electrodes 57 are both located between the second piezoelectric layer 52 and the insulating layer 53. In order to achieve such a configuration, the second conductor 56 and the auxiliary electrodes 57 may be formed in the same process, and therefore, a process for manufacturing the piezoelectric actuator 22 may be simplified.

In the first illustrative embodiment, each of the auxiliary electrodes 57 overlaps the overlapping portions of the corresponding pressure chambers 40 in the top-bottom direction. The overlapping portions of the pressure chambers 40 overlap the first connection portions 55b. This configuration may therefore increase strength of each particular portion, which overlaps a corresponding pressure chamber 40, of the piezoelectric actuator 22. Nevertheless, the auxiliary electrodes 57 do not overlap any portion of the electrode portions 55a. This configuration may therefore reduce or minimize inhibition of deformation of the first piezoelectric layer 51, the second piezoelectric layer 52, and the insulating layer 53 when the piezoelectric actuator 22 is activated.

Second Illustrative Embodiment

Hereinafter, a second illustrative embodiment will be described. In the second illustrative embodiment, an auxiliary electrode has a different configuration from the auxiliary electrodes 57 of the first illustrative embodiment, but otherwise the other configuration according to the second illustrative embodiment is the same or similar to the configuration according to the first illustrative embodiment. Therefore, an explanation will be given mainly for the parts different from the first illustrative embodiment.

Figure 8A:
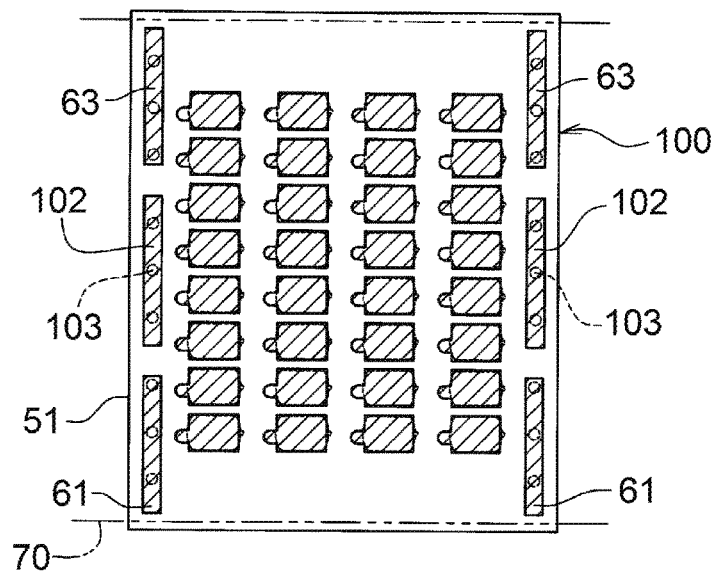
FIG. 8A illustrates an upper surface of a first piezoelectric layer of a piezoelectric actuator in a second illustrative embodiment according to one or more aspects of the disclosure.
Figure 8B:
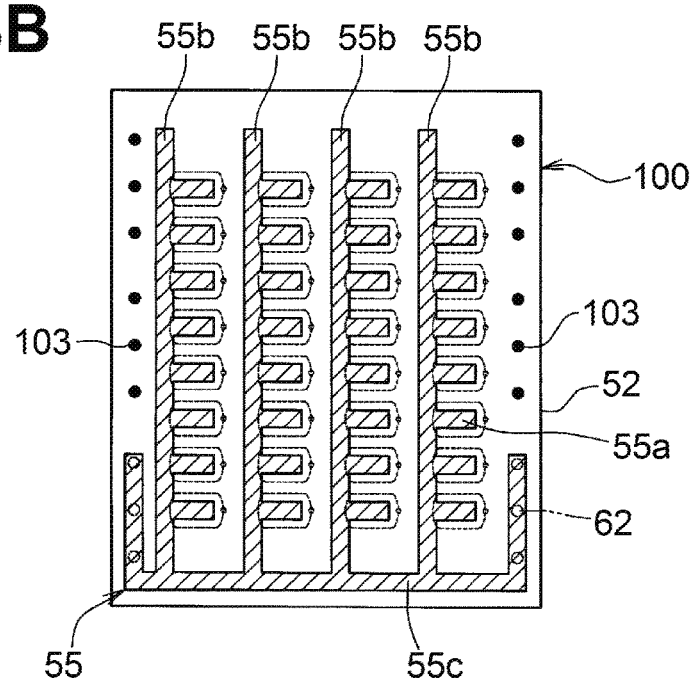
FIG. 8B illustrates an upper surface of a second piezoelectric layer of the piezoelectric actuator in the second illustrative embodiment according to one or more aspects of the disclosure.
Figure 9:
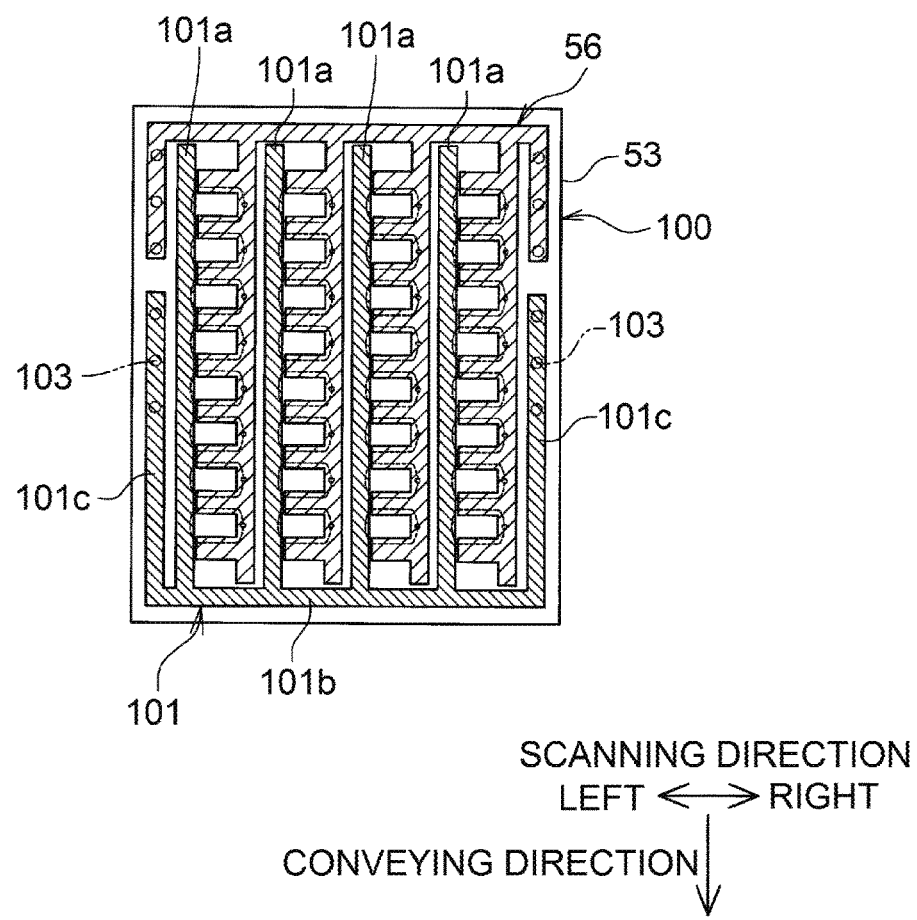
FIG. 9 illustrates an upper surface of an insulating layer of the piezoelectric actuator in the second illustrative embodiment according to one or more aspects of the disclosure.

As illustrated in FIGS. 8A, 8B and 9, a piezoelectric actuator 100 includes an auxiliary electrode 101 that is disposed between the second piezoelectric layer 52 and the insulating layer 53. The auxiliary electrode 101 includes a plurality of, for example, four, strip-shaped portions 101a and a connecting portion 101b. The strip-shaped portions 101a correspond one-to-one to the first connecting portions 55b of the first conductor 55. The strip-shaped portions 101a extend along the conveying direction and overlap the respective first connecting portions 55b. The strip-shaped portions 101a have substantially the same shape as the respective first connecting portions 55b in plan view. The strip-shaped portions 101a substantially entirely overlap the respective first connecting portions 55b in the top-bottom direction. Therefore, each of the strip-shaped portions 101a overlaps the overlapping portions of the corresponding pressure chambers 40 in the top-bottom direction. The overlapping portions of the pressure chambers 40 overlap the first connection portions 55b. Nevertheless, the strip-shaped portions 101a do not overlap any portion of the electrode portions 55a.

The connecting portion 101b extends in the scanning direction, and connects between downstream ends of the strip-shaped portions 101a in the conveying direction. The connecting portion 101b includes an extended portion 101c at each end in the scanning direction. The extended portions 101c extend upstream in the conveying direction from the respective ends of the connecting portion 101b to respective positions between the surface electrode 61 and the surface electrode 63 in the conveying direction. In contrast to the auxiliary electrodes 57 of the first illustrative embodiment, the auxiliary electrode 101 is not connected to the first conductor 55.

The first piezoelectric layer 51 further includes surface electrodes 102 that overlap the respective extended portions 101c, on the upper surface thereof. Each of the surface electrodes 102 is located between the surface electrode 61 and the surface electrode 63 in the conveying direction at each end portion with respect to the scanning direction. The piezoelectric actuator 100 has three each of through holes 103, which penetrate through the second piezoelectric layer 52, at each end portions with respect to the scanning direction such that the three through holes 103 are sandwiched between one of the surface electrodes 102 of the first piezoelectric layer 51 and its corresponding extended portion 101c of the second piezoelectric layer 52 at each end portion. The through holes 103 enable the auxiliary electrode 101 to be connected to the surface electrodes 102. The surface electrodes 102 are connected to the COF 70 and further connected to the power source (not illustrated) via the wirings of the COF 70. The auxiliary electrode 101 is maintained at a certain potential level (e.g., approximately 10V) (which is an example of a third potential) between the driving potential and the ground potential.

Similar to the first illustrative embodiment, when the potential of a large number of individual electrodes 54 are changed simultaneously for activating the piezoelectric actuator 100, charge application to one or more of the target electrode portions 55a from appropriate one of the first connecting portions 55b may lag behind charge application to the others of the target electrode portions 55a from appropriate one of the first connecting portions 55b (i.e., delay may occur when charge is applied to the target electrode portions 55a).

Figure 10:
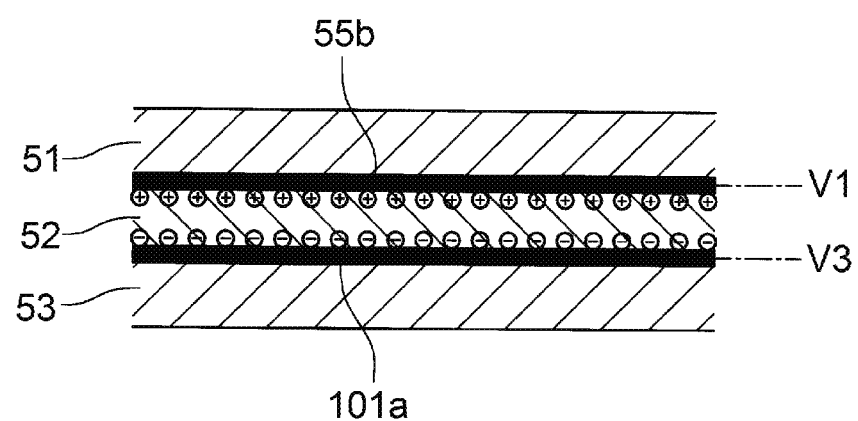
FIG. 10 illustrates a portion of the piezoelectric actuator, in which charge is accumulated between a first connecting portion and an auxiliary electrode in the second illustrative embodiment according to one or more aspects of the disclosure.
Figure 11A:
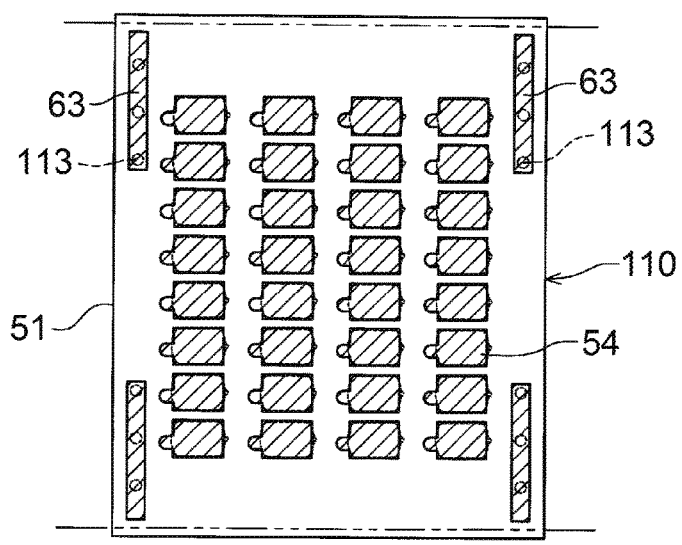
FIG. 11A illustrates an upper surface of a first piezoelectric layer of a piezoelectric actuator in a third illustrative embodiment according to one or more aspects of the disclosure.
Figure 11B:
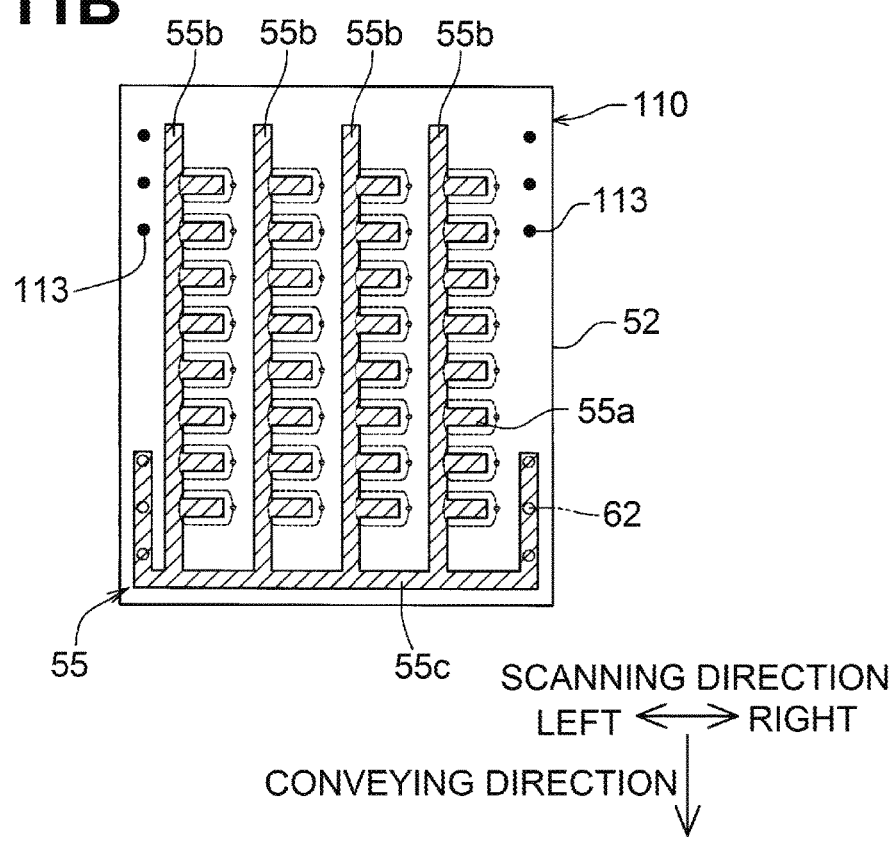
FIG. 11B illustrates an upper surface of a second piezoelectric layer of the piezoelectric actuator in the third illustrative embodiment according to one or more aspects of the disclosure.
Figure 12A:
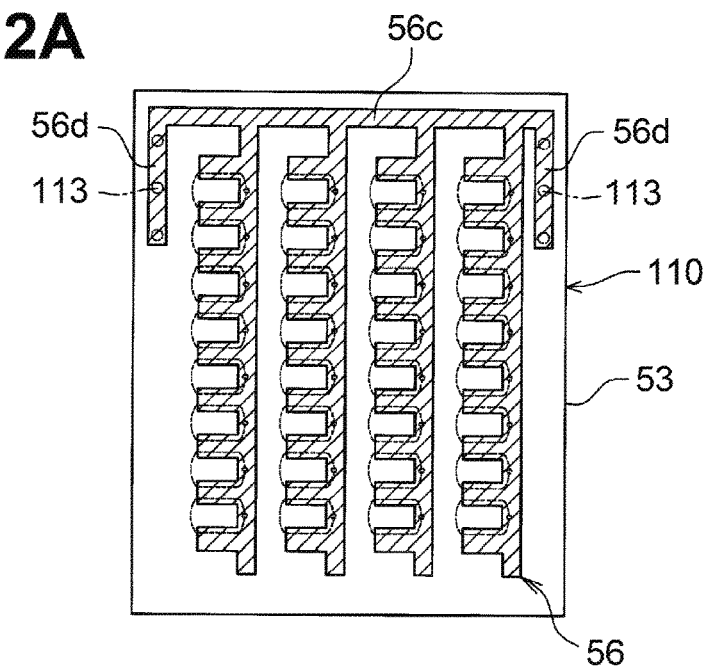
FIG. 12A illustrates an upper surface of an insulating layer of the piezoelectric actuator in the third illustrative embodiment according to one or more aspects of the disclosure.
Figure 12B:
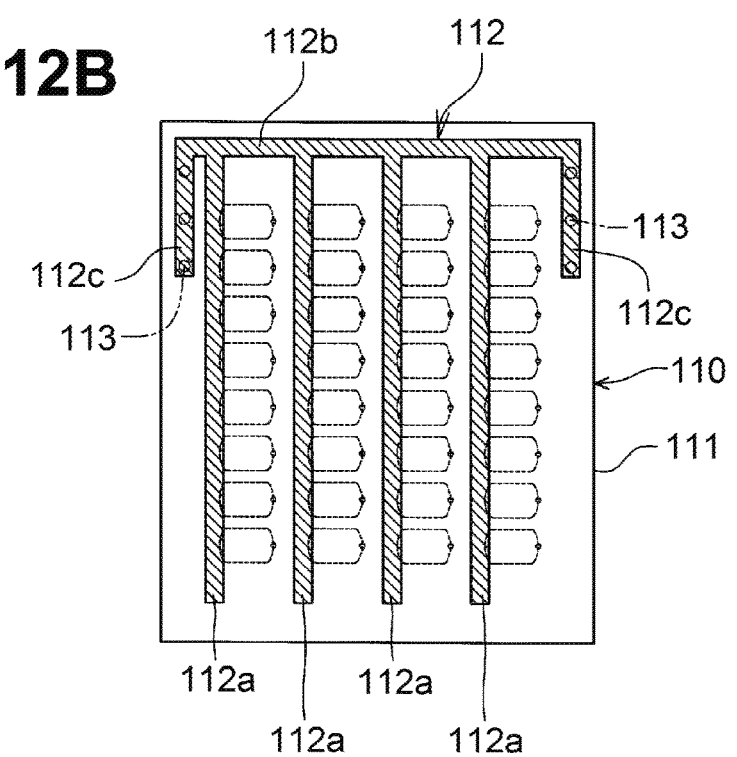
FIG. 12B illustrates an upper surface of another insulating layer of the piezoelectric actuator in the third illustrative embodiment according to one or more aspects of the disclosure.
Figure 13:
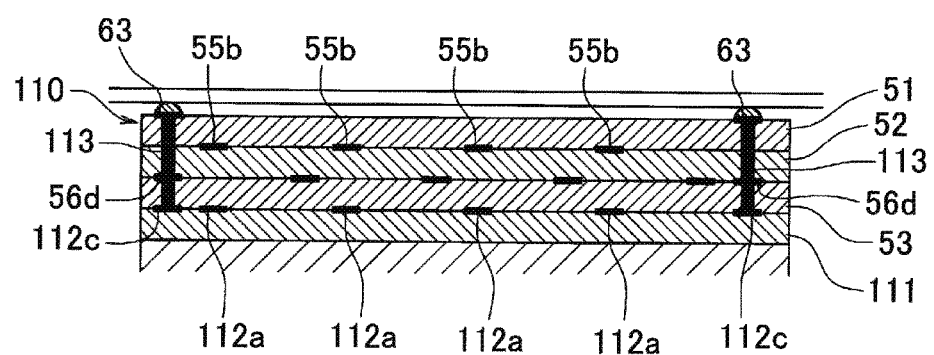
FIG. 13 corresponds to FIG. 7B and is a sectional view of a portion of the piezoelectric actuator of an inkjet head in the third illustrative embodiment according to one or more aspects of the disclosure.

In order to reduce or avoid an occurrence of such a delay, in the second illustrative embodiment, the auxiliary electrode 101 is provided overlapping the first connecting portions 55b of the first conductor 55 and is maintained at the third potential which is between the driving potential and the ground potential. Therefore, as illustrated in FIG. 10, charge is accumulated between each of the first connecting portions 55b and its corresponding strip-shaped portion 101a due to potential difference between the first connecting portions 55b maintained at the driving potential and the auxiliary electrode 101 maintained at the third potential. In FIG. 10, "V1" indicates the driving potential (as an example of the first potential), and "V3" indicates the third potential. When current flows to each of the target electrode portions 55a, charge accumulated in a corresponding first connecting portion 55b and charge accumulated in its corresponding auxiliary electrode 101 are both applied to each of the electrode portions 55a. This configuration may therefore enable to reduce or prevent delay of charge application to the target electrode portions 55a. In the second illustrative embodiment, the strip-shaped portions 101a of the auxiliary electrode 101 overlap the respective first connecting portions 55b entirely, which may result in avoiding increase of the size of the piezoelectric actuator 100 in the scanning direction and in the conveying direction.

If potential difference between the first conductor 55 and the auxiliary electrode 101 is significantly large, shorting of the first connecting portions 55b and the auxiliary electrode 101 may occur when cracking occurs in the insulating layer 53. More specifically, in a case where the potential difference between the first conductor 55 and the auxiliary electrode 101 is greater than the potential difference between the first conductor 55 and the second conductor 56, when a small cracking, which does not cause shorting of the first conductor 55 at the driving potential and the second conductor 56 at the ground potential, occurs in the insulating layer 53, shorting of the first connecting portions 55*b* and the auxiliary electrode 101 may occur. Therefore, in the second illustrative embodiment, the potential of the auxiliary electrode 101 is maintained at the certain potential level (e.g., the third potential) between the driving potential and the ground potential. This may therefore result in reducing or preventing an occurrence of shorting of the first connecting portions 55*b* and the auxiliary electrode 101 when cracking occurs in the insulating layer 53.

In the second illustrative embodiment, the first conductor 55 includes the four first connecting portions 55*b*, and the auxiliary electrode 101 includes the four strip-shaped portions 101*a* for the respective first connecting portions 55*b* correspondingly. This configuration may therefore enable to reduce or prevent delay of charge application to the target electrode portions 55*a*. In light of such circumstances, in the second illustrative embodiment, also, providing the strip-shaped portions 101*a* of the auxiliary electrodes 101 for particularly the two first connecting portions 55*b* located between the endmost first connecting portions 55*b* in the scanning direction may have a great effect on reducing or preventing delay of charge application to the target electrode portions 55*a*.

In the second illustrative embodiment, each of the strip-shaped portions 101*a* overlaps the overlapping portions of the corresponding pressure chambers 40 in the top-bottom direction. The overlapping portions of the pressure chambers 40 face the first connection portions 55*b*. This configuration may therefore increase strength of each particular portion, which overlaps a corresponding pressure chamber 40, of the piezoelectric actuator 100. Nevertheless, the strip-shaped portions 101*a* of the auxiliary electrode 101 do not overlap any portion of the electrode portions 55*a*. This configuration may therefore reduce or minimize inhibition of deformation of the first piezoelectric layer 51, the second piezoelectric layer 52, and the insulating layer 53 when the piezoelectric actuator 100 is activated.

In the second illustrative embodiment, the second conductor 56 and the auxiliary electrode 101 are located between the second piezoelectric layer 52 and the insulating layer 53. In order to achieve such a configuration, the second conductor 56 and the auxiliary electrode 101 may be formed in the same process, and therefore, a process for manufacturing the piezoelectric actuator 100 may be simplified.

Third Illustrative Embodiment

Hereinafter, a third illustrative embodiment will be described. In the third illustrative embodiment, an auxiliary electrode has a different configuration from the auxiliary electrodes 57 of the first illustrative embodiment and the auxiliary electrode 101 of the second illustrative embodiment, but otherwise the other configuration according to the third illustrative embodiment is the same or similar to the configuration according to the first and second illustrative embodiments. Therefore, an explanation will be given mainly for the parts different from the first and second illustrative embodiments.

As illustrated in FIGS. 11A, 11B, 12A, 12B and 13, a piezoelectric actuator 110 includes another insulating layer 111 in addition to the first and second piezoelectric layers 51 and 52 and the insulating layer 53. The insulating layer 111 is disposed between the insulating layer 53 and the channel unit 21 in the top-bottom direction. The insulating layer 111 may be made of insulating material that is the same as that used for the insulating layer 111. A lamination of the first piezoelectric layer 51, the second piezoelectric layer 52, and the insulating layers 53 and 111 corresponds to the laminated member.

The piezoelectric actuator 110 further includes an auxiliary electrode 112 between the insulating layer 53 and the insulating layer 111 (e.g., on the lower surface, which does not face the second piezoelectric layer 52, of the insulating layer 53). The auxiliary electrode 112 includes a plurality of, for example, four, strip-shaped portions 112*a* and a connecting portion 112*b*. The strip-shaped portions 112*a* correspond one-to-one to the first connecting portions 55*b* of the first conductor 55. The strip-shaped portions 101*a* overlap the respective first connecting portions 55*b*. The strip-shaped portions 112*a* have substantially the same shape as the respective first connecting portions 55*b* in plan view. The strip-shaped portions 101*a* substantially entirely overlap the respective first connecting portions 55*b* in the top-bottom direction. Thus, each of the strip-shaped portions 112*a* faces the overlapping portions of the corresponding pressure chambers 40 in the top-bottom direction. The overlapping portions of the pressure chambers 40 face the first connection portions 55*b*. Nevertheless, the strip-shaped portions 112*a* of the auxiliary electrode 112 do not overlap any portion of the electrode portions 55*a*.

The connecting portion 112*b* extends in the scanning direction, and connects between upstream ends of the strip-shaped portions 112*a* in the conveying direction. The connecting portion 112*b* includes an extended portion 112*c* at each end in the scanning direction. The extended portions 112*c* extend downstream in the conveying direction from the respective ends of the connecting portion 56*c*. With this configuration, the connecting portion 112*b* of the auxiliary electrode 112 overlaps the entire portion of the connecting portion 56*c* of the second conductor 56. In contrast to the auxiliary electrodes 57 of the first illustrative embodiment, the auxiliary electrode 112 is not connected to the first conductor 55.

The piezoelectric actuator 110 has three each of through holes 113, which penetrate through the first piezoelectric layer 51, the second piezoelectric layer 52, and the insulating layer 53, at each end portions with respect to the scanning direction such that the three through holes 113 are sandwiched between one of the surface electrodes 102 of the first piezoelectric layer 51 and its corresponding extended portion 112*c* of the second piezoelectric layer 52 at each end portion. The through holes 103 enable the auxiliary electrode 112 to be connected to the second conductor 56 and the surface electrodes 112 to be maintained at the ground potential.

Similar to the first and second illustrative embodiment, when the potential of a large number of individual electrodes 54 are changed simultaneously for activating the piezoelectric actuator 110, charge application to one or more of the target electrode portions 55*a* from appropriate one of the first connecting portions 55*b* may lag behind charge application to the others of the target electrode portions 55*a* from appropriate one of the first connecting portions 55*b* (i.e., delay may occur when charge is applied to the target electrode portions 55*a*).

In order to avoid an occurrence of such a delay, in the third illustrative embodiment, the strip-shaped portions 112*a* of the auxiliary electrode 112 are provided overlapping the respective first connecting portions 55*b*, and the auxiliary electrode 112 is maintained at the ground potential. Therefore, charge is accumulated between each of the first connecting portions 55b and the auxiliary electrode 112 due to potential difference between each of the first connecting portions 55b and the auxiliary electrode 112. When current flows to each of the target electrode portions 55a, charge accumulated in a corresponding first connecting portion 55b and charge accumulated in its corresponding auxiliary electrode 112 are both applied to each of the electrode portions 55a. This configuration may therefore enable to reduce or prevent delay of charge application to the target electrode portions 55a. In the third illustrative embodiment, the strip-shaped portions 112a of the auxiliary electrode 112 overlap the respective first connecting portions 55b entirely, which may result in avoiding increase of the size of the piezoelectric actuator 110 in the scanning direction and in the conveying direction.

In the third illustrative embodiment, the potential difference between the first conductor 55 and the auxiliary electrode 112 is equal to the potential difference between the first conductor 55 and the second conductor 56. Therefore, if the distance between the first connecting portions 55b and the auxiliary electrode 112 is shorter than the distance between the first conductor 55 and the second conductor 56, shorting of the first connecting portions 55b and the auxiliary electrode 112 may occur when cracking occurs in the second piezoelectric layer 52 or in the insulating layer 53 or both. Nevertheless, in the third illustrative embodiment, the auxiliary electrode 112 is disposed between the insulating layer 53 and the insulating layer 111, that is, the auxiliary electrode 112 is disposed farther from the first conductor 55 than the second conductor 56. This may therefore result in reducing or preventing an occurrence of shorting of the first connecting portions 55b and the auxiliary electrode 112 when cracking occurs in the second piezoelectric layer 52 or in the insulating layer 53 or both.

In the third illustrative embodiment, the first conductor 55 includes the four first connecting portions 55b, and the auxiliary electrode 112 includes the four strip-shaped portions 112a for the respective first connecting portions 55b correspondingly. This configuration may therefore enable to reduce or prevent delay of charge application to the target electrode portions 55a reliably. In light of such circumstances, in the third illustrative embodiment, also, providing the strip-shaped portions 112a of the auxiliary electrodes 112 for particularly the two first connecting portions 55b located between the endmost first connecting portions 55b in the scanning direction may have a great effect on reducing or reducing delay of charge application to the target electrode portions 55a.

In the third illustrative embodiment, each of the strip-shaped portions 112a overlaps the overlapping portions of the corresponding pressure chambers 40 in the top-bottom direction. The overlapping portions of the pressure chambers 40 overlap the first connection portions 55b. This configuration may therefore increase strength of each particular portion, which overlaps a corresponding pressure chamber 40, of the piezoelectric actuator 110. Nevertheless, the strip-shaped portions 112a of the auxiliary electrode 101 do not overlap any portion of the electrode portions 55a. This configuration may therefore reduce or minimize inhibition of deformation of the first piezoelectric layer 51, the second piezoelectric layer 52, the insulating layer 53, and the insulating layer 111 when the piezoelectric actuator 110 is activated.

Hereinafter, variations in which various changes or modifications are applied to the first, second, and third illustrative embodiment will be described.

Figure 14A:
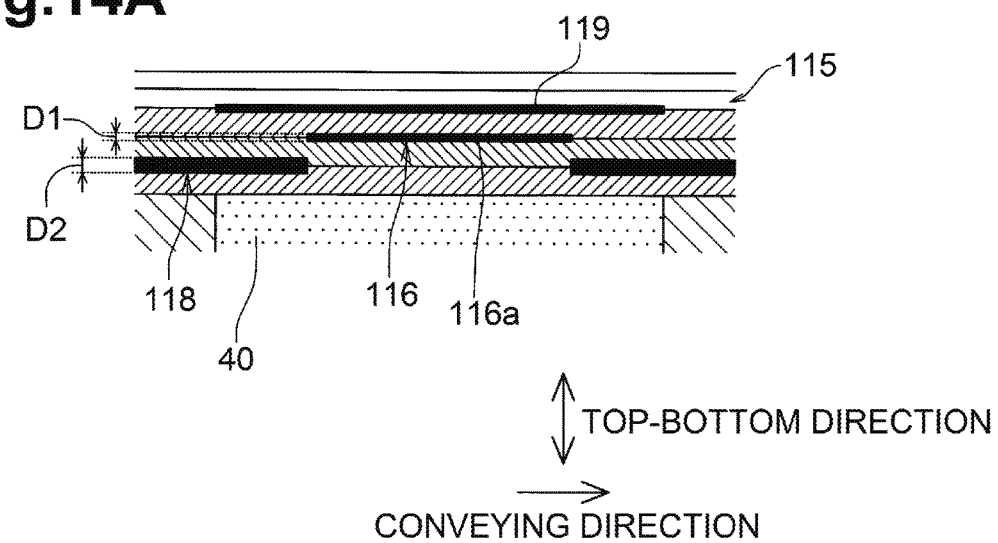
FIG. 14A corresponds to FIG. 6 and is a sectional view of a portion of a piezoelectric actuator of an inkjet head in a first variation according to one or more aspects of the disclosure.
Figure 14B:
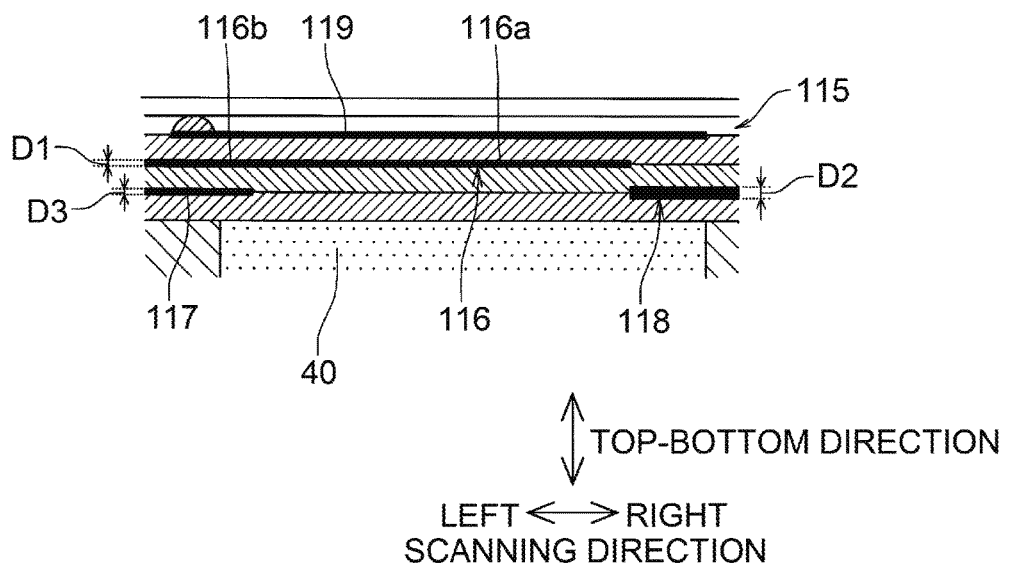
FIG. 14B corresponds to FIG. 7B and is a sectional view of another portion of the piezoelectric actuator of the inkjet head in the first variation according to one or more aspects of the disclosure.

In the first illustrative embodiment, the individual electrodes 54, the first conductor 55, the second conductor 56, and the auxiliary electrodes 57 have substantially equal thickness. Nevertheless, in a first variation, for example, as illustrated in FIGS. 14A and 14B, a first conductor 116 (including electrode portions 116a and first connecting portions 116b (only one each of which is illustrated in FIGS. 14A and 14B)) has a thickness D1, a second conductor 118 has a thickness D2, and an auxiliary electrode 117 has a thickness D3. Each of the thickness D1 of the first conductor 116 and the thickness D3 of the auxiliary electrode 117 is half of the thickness D2 of the second conductor 118, and a sum of the thickness D1 and the thickness D3 is equal to the thickness D2. An individual electrode 119 has a thickness that is, for example, equal to the thickness D1 of the first conductor 116 and the thickness D3 of the auxiliary electrode 117.

In the first variation, the thickness D1 of each of the electrode portions 116a of the first conductor 116 is thinner than the thickness of each of the electrode portions 55a of the first conductor 55 according to the illustrative embodiments. The reduction of the thickness D1 of each of the electrode portions 116a of the first conductor 116 may provide less rigidity to a portion, which overlaps a central portion of a pressure chamber 40, of the piezoelectric actuator 115. Therefore, as compared with the illustrative embodiments, this configuration may enable the first piezoelectric layer 51, the second piezoelectric layer 52, and the insulating layer 53 to deform greater when the piezoelectric actuator 115 is activated.

The reduction of the thickness D1 of the first conductor 116 may however cause decrease in accumulation amount of charge in the first conductor 116, which may result in decrease of charge that can be applied to each of the electrode portions 116a from a corresponding first connecting portion 116b. In order to avoid such a problem, in the first variation, the auxiliary electrode 117 is connected to the first connecting portions 116b. Therefore, charge accumulated in the first connecting portions 116b and charge accumulated in the auxiliary electrode 117 may be both applied to the electrode portions 116a. Consequently, delay of charge application to the target electrode portions 116a may be reduced or prevented.

For example, it is assumed that a piezoelectric actuator includes a first conductor and a second conductor but no auxiliary electrode. The first and second conductors have thicknesses that are able to apply charge to electrode portions sufficiently. In this case, however, such thicknesses of the first and second conductors may cause some insufficiency in deformation of the first piezoelectric layer 51, the second piezoelectric layer 52, and the insulating layer 53. On the other hand, in the first variation, the piezoelectric actuator 115 includes the auxiliary electrode 117. The thickness D1 of the first conductor 116 and the thickness D3 of the auxiliary electrode 117 are relatively thin and a sum of the thickness D1 of the first conductor 116 and the thickness D3 of the auxiliary electrode 117 is equal to the thickness D2 of the second conductor 118. Because the first conductor 116 and the second conductor 118 have a relatively thin thickness, the first piezoelectric layer 51, the second piezoelectric layer 52, and the insulating layer 53 may be deformed sufficiently. Further, in the first variation, the electrode portions 116a may be applied with substantially the same amount of charge as that to be applied to electrode portions from the first connecting portions 116b having the thickness D1 that is equal to the thickness D3 of the second conductor 118, in cooperation with the first connecting portion 116b and the auxiliary electrode 117 without affecting deformation of the first piezoelectric layer 51, the second piezoelectric layer 52, and the insulating layer 53.

In the first variation, the thickness D1 of the first conductor 116 and the thickness D3 of the auxiliary electrode 117 each have half thickness of the thickness D2 of the second conductor 118. In other variations, for example, the thickness D1 and the thickness D3 may be different from each other if the sum of the thickness D1 and the thickness D3 is equal to the thickness D2. In such a case, in one example, if the thickness D1 is thinner than the thickness D3, this may provide less rigidity to each portion, which may overlap a corresponding pressure chamber 40, of the piezoelectric actuator 115. Therefore, as compared with the illustrative embodiments, this configuration may enable the first piezoelectric layer 51, the second piezoelectric layer 52, and the insulating layer 53 to deform greater when the piezoelectric actuator 115 is activated. In another example, if the thickness D1 is thicker than the thickness D3, the amount of charge that can be applied to the electrode portions 116a from the first connecting portions 116b, which are located closer to the electrode portions 116a than the auxiliary electrode 117, may be increased. This may therefore result in reducing or preventing delay of charge application to the electrode portions 116a.

In other variations, for example, the sum of the thickness D1 of the first conductor 116 and the thickness D3 of the auxiliary electrode 117 may be different from the thickness D2 of the second conductor 118. In such a case, if the thickness D1 of the first conductor 116 is thinner than the thickness D2 of the second conductor 118, this may provide less rigidity to each portion, which may overlap a corresponding pressure chamber 40, of a piezoelectric actuator. Therefore, as compared with the illustrative embodiments, this configuration may enable the first piezoelectric layer 51, the second piezoelectric layer 52, and the insulating layer 53 to deform greater when the piezoelectric actuator is activated. In such a case, if the auxiliary electrode 117 is provided in the piezoelectric actuator, charge accumulated in the first connecting portions 116b and charge accumulated in the auxiliary electrode 117 may both be applied to the electrode portions 116a. Consequently, delay of charge application to the electrode portions 116a may be reduced or prevented.

In the variations above, the description has been made on the relative thicknesses of the first conductor, the second conductor, and the auxiliary electrode corresponding to those of the first illustrative embodiment. Nevertheless, the same changes or modifications may also be applied to the relative thicknesses of the first conductor, the second conductor, and the auxiliary electrode according to each of the second and third illustrative embodiments.

In the first illustrative embodiment, the first conductor 55 includes the four first connecting portions 55b, and the four auxiliary electrodes 57 are provided for the respective first connecting portions 55b correspondingly. Nevertheless, the configuration is not be limited to such a specific example. In one variation of the first illustrative embodiment, the auxiliary electrodes 57 may be provided for only the first connecting portions 55b located between the endmost first connecting portions 55b in the scanning direction. The target two first connecting portions 55b are located farther from the second through holes 62 than the endmost first connecting portions 55b. Similar to this, in a variation of the second illustrative embodiment, for example, the strip-shaped portions 101a of the auxiliary electrode 101 may be provided for only the first connecting portions 55b located between the endmost first connecting portions 55b in the scanning direction. The target two first connecting portions 55b are located farther from the second through holes 62 than the endmost first connecting portions 55b. In a variation of the third illustrative embodiment, for example, the strip-shaped portions 112a of the auxiliary electrode 112 may be provided for only the first connecting portions 55b located between the endmost first connecting portions 55b in the scanning direction. The target two first connecting portions 55b are located farther from the second through holes 62 than the endmost first connecting portions 55b.

In another variation of the first illustrative embodiment, for example, if one of the end portions (e.g., the extended portions 55d) of the second connecting portion 55c in the scanning direction is connected to the second through holes 62, the auxiliary electrode 57 may be provided for at least the first connecting portion 55b located farthest from the end portion connected to the second through holes 62 (e.g., at least the leftmost or rightmost first connecting portion 55b). Similar to this, in another variation of the second illustrative embodiment, for example, one of the end portions (e.g., the extended portions 55d) of the second connecting portion 55c in the scanning direction is connected to the second through holes 62, the strip-shaped portion 101a of the auxiliary electrode 101 may be provided for at least the first connecting portion 55b located farthest from the end portion connected to the second through holes 62 (e.g., at least the leftmost or rightmost first connecting portion 55b). In another variation of the third illustrative embodiment, for example, one of the end portions (e.g., the extended portions 55d) of the second connecting portion 55c in the scanning direction is connected to the second through holes 62, the strip-shaped portion 112a of the auxiliary electrode 112 may be provided for at least the first connecting portion 55b located farthest from the end portion connected to the second through holes 62 (e.g., at least the leftmost or rightmost first connecting portion 55b).

In the first illustrative embodiment, the end portions of each of the auxiliary electrodes 57 are connected to the end portions of a corresponding one of the first connecting portions 55b in the conveying direction via the respective first through holes 65. Nevertheless, in another variation of the first illustrative embodiment, in one example, the auxiliary electrodes 57 may be connected to only the downstream end portions (e.g., the end portions which are connected to the second connecting portion 55c) of the respective first connecting portions 55b in the conveying direction via the respective first through holes 65. This configuration may also therefore enable the auxiliary electrodes 57 to be connected to the respective first connecting portions 55b at respective positions close to the second connecting portion 55c. Therefore, charge may tend to be easily applied to the auxiliary electrodes 57 from the power source. Consequently, charge may be applied to a target electrode portion 55a from an appropriate one of the auxiliary electrode 57 effectively. This may therefore result in reducing or preventing delay of charge application to the target electrode portions 55a effectively.

In another example, the auxiliary electrodes 57 may be connected to only the upstream end portions (e.g., the end portions which are not connected to the second connecting portion 55c of the respective first connecting portions 55c) of the respective first connecting portions 55b in the conveying direction via the respective first through holes 65. In still another example, the auxiliary electrodes 57 may be connected to other portions (e.g., middle portions) of the respective first connecting portions 55b in the conveying direction via first through holes.

In further another example, the auxiliary electrodes 57 might not necessarily be connected to the respective first connecting portions 55b via respective first through holes. For example, another conductors may be provided at one of sides of the insulating layer 53, and the auxiliary electrodes 57 may be connected to one ends of the respective first connecting portions 55b via the conductors.

In the second illustrative embodiment, the auxiliary electrode 101 is maintained at the potential level between the driving potential and the ground potential. Nevertheless, in one variation of the second illustrative embodiment, for example, the auxiliary electrode 101 may be maintained at another potential level higher than or lower than the driving potential.

In the first, second, and third illustrative embodiments, the first conductor 55 is maintained at the driving potential and the second conductor 56 is maintained at the ground potential. Nevertheless, in variations of the first, second, and third illustrative embodiments, the first conductor 55 may be maintained at a first potential different from the driving potential, and the second conductor 56 may be maintained at a second potential different from the first potential and the ground potential. For example, the first conductor 55 may be maintained at the ground potential and the second conductor 56 may be maintained at the driving potential.

In such a case, in one variation of the second illustrative embodiment, if the auxiliary electrode 101 is maintained at a particular potential between the first potential and the second potential, an occurrence of shorting of the first connecting portions 55b and the auxiliary electrode 101 may be reduced or prevented. In another variation of the second illustrative embodiment, the auxiliary electrode 101 may be maintained at another particular potential that may be different from the first potential, the second potential, and the potential between the first potential and the second potential.

In the first illustrative embodiment, the auxiliary electrodes 57 are located on the same surface as the second conductor 56. In the second illustrative embodiment, the auxiliary electrode 101 is located on the same surface as the second conductor 56. Nevertheless, in another variation of the first and second illustrative embodiments, the auxiliary electrodes 57 or the auxiliary electrode 101 may be located on a different surface from the second conductor 56. For example, the auxiliary electrodes 57 or the auxiliary electrode 101 may be disposed on the upper surface of the first piezoelectric layer 51.

In the third illustrative embodiment, the auxiliary electrode 112 is disposed between the insulating layer 53 and the insulating layer 111 (e.g., on the lower surface of the insulating layer 53), and the auxiliary electrode 112 is farther from the first conductor 53 than the second conductor 56. Nevertheless, the auxiliary electrode 112 may be disposed on a different surface. For example, the auxiliary electrode 112 may be disposed on the upper surface of the first piezoelectric layer 51.

The relative positional relationship between the first conductor 55 and the auxiliary electrode 57, 101, 112 is not limited to the specific examples of the first, second, and third illustrative embodiments. In a second variation, for example, as illustrated in FIG. 15, a piezoelectric actuator 120 includes an auxiliary electrode 121 that has substantially the same shape in plan view as a combination of the first connecting portions 55b and the second connecting portion 55c (refer to FIG. 3B) of the first conductor 55. In this case, the auxiliary electrode 121 entirely overlaps the first connecting portions 55b and the second connecting portion 55c of the first conductor 55.

In the second variation, the auxiliary electrode 121 includes strip-shaped portions 121a corresponding to the respective first connecting portions 55b of the first conductor 55. End portions of each of the strip-shaped portions 121a are connected to the end portions of a corresponding one of the first connecting portions 55b via respective first through holes 122a defined in the second piezoelectric layer 52. The auxiliary electrode 121 further includes extended portions 122b overlapping the respective extended portions 55d of the first conductor 55. The extended portions 122b of the auxiliary electrode 121 are connected to the respective extended portions 55d of the first conductor 55 via second through holes 122b defined in the second piezoelectric layer 52. In the second variation, the auxiliary electrode 121 has an area that is substantially equal to a total area of the first connecting portions 55b and the second connecting portion 55c. This configuration may therefore enable sufficient charge application to the electrode portions 55a from the first connecting portions 55b and the auxiliary electrode 121.

Figure 16:
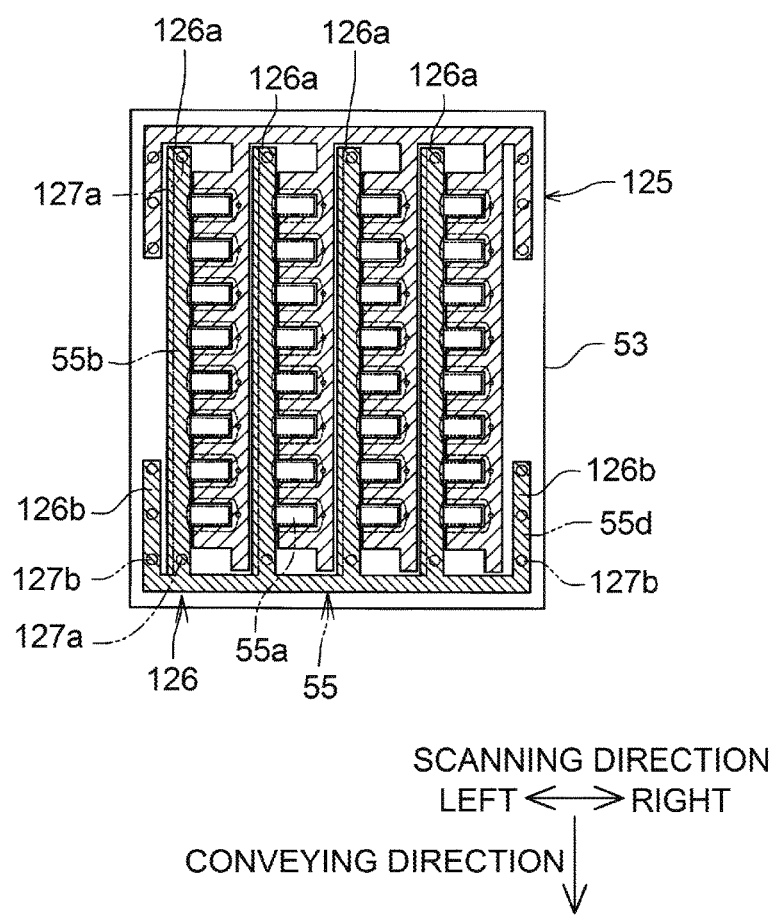
FIG. 16 illustrates an upper surface of an insulating layer of a piezoelectric actuator in a third variation according to one or more aspects of the disclosure.

In a third variation, for example, as illustrated in FIG. 16, a piezoelectric actuator 125 includes an auxiliary electrode 126. The auxiliary electrode 126 includes strip-shaped portions 126a corresponding to the respective first connecting portions 55b (refer to FIG. 3B) of the first conductor 55. The strip-shaped portions 126a of the auxiliary electrode 126 are slightly wider in the scanning direction than the strip-shaped portions 121a of the auxiliary electrode 121 of the second variation. More specifically, for example, the strip-shaped portions 126a of the auxiliary electrode 126 extend in the scanning direction such that a left end of each of the strip-shaped portions 126a protrude beyond a left end of each of the corresponding first connecting portions 55b in the scanning direction. A right end of each of the strip-shaped portions 126a of the auxiliary electrode 126 coincides with a right end of each of the corresponding first connecting portions 55b in the scanning direction. Therefore, the strip-shaped portions 126a of the auxiliary electrode 126 do not overlap any portions of the electrode portions 55a. The other portions of the auxiliary electrode 126 have the same or similar configuration to those of the auxiliary electrode 121. In FIG. 16, the first conductor 55 is indicated by a double-dotted-and-dashed line for easier understanding of the positional relationship between the auxiliary electrode 126 and the first conductor 55.

In the third variation, the auxiliary electrode 126 includes strip-shaped portions 126a corresponding to the respective first connecting portions 55b of the first conductor 55. End portions of each of the strip-shaped portions 121a in the conveying direction are connected to the end portions of a corresponding one of the first connecting portions 55b in the conveying direction via respective first through holes 127a defined in the second piezoelectric layer 52. The auxiliary electrode 126 further includes extended portions 127b overlapping the respective extended portions 55d of the first conductor 55. The extended portions 122b of the auxiliary electrode 126 are connected to the respective extended portions 55d of the first conductor 55 via second through holes 126b defined in the second piezoelectric layer 52. In the third variation, the auxiliary electrode 126 has an area that is larger than the total area of the first connecting portions 55b and the second connecting portion 55c. This configuration may therefore enable more sufficient charge application to the electrode portions 55a from the first connecting portions 55*b* and the auxiliary electrode 126 as compared with the configuration of the second variation.

In another variation of the second and third variation, similar to the second variation, for example, an auxiliary electrode may entirely overlap the first connecting portions 55*b* and the second connecting portion 55*b*. In a still another variation of the second and third variation, similar to the third variation, for example, one ends of strip-shaped portions of an auxiliary electrode may protrude beyond the one ends of the corresponding first connecting portions 55*b* in the scanning direction.

In the first, second, and third illustrative embodiments, the nozzle rows 38 are aligned along the scanning direction in four rows, and the individual electrodes 49 and electrode portion rows 47 and 48 are each aligned in four rows correspondingly. Nevertheless, in other variations, for example, the inkjet head 3 may have less (e.g., one, two, or three) or more (e.g., five or more) nozzle rows 38 and the same number of individual electrode rows 49 and the electrode portion rows 48 and 47 as the number of nozzle rows 38. In such a case, the auxiliary electrodes 57 and the strip-shaped portions 101*a* and 112*a* of the auxiliary electrodes 101 and 112 may be provided correspondingly to the number of the electrode portion rows 48.

In each of the first, second, and third illustrative embodiments, the auxiliary electrodes 57, the strip-shaped portions 101*a* of the auxiliary electrode 101, or the strip-shaped portions 112*a* of the auxiliary electrode 112 are located so as to overlap the overlapping portions of the pressure chambers 40 but not to overlap any portion of the electrode portions 55*a*. Nevertheless, in other variations, in one example, the auxiliary electrodes 57, the strip-shaped portions 101*a* of the auxiliary electrode 101, or the strip-shaped portions 112*a* of the auxiliary electrode 112 may overlap a portion of each of the electrode portions 55*a*. The overlapping portion of each of the electrode portions 55*a* is closer to the first connecting portion 55*b* than the other portion of each of the electrode portions 55*a*. In another example, the auxiliary electrodes 57, the strip-shaped portions 101*a* of the auxiliary electrode 101, or the strip-shaped portions 112*a* of the auxiliary electrode 112 may be located so as not to overlap any portions of the pressure chambers 40.

In the illustrative embodiments and the variations, each of the electrode portions 55*a* of the first conductor 55 overlaps a central portion of a corresponding one of the individual electrodes 54 in the conveying direction, and each of the electrode portions 56*a* of the second conductor 56 overlaps confronting end portions of corresponding adjacent individual electrodes 54 in the conveying direction. Nevertheless, in other variation, for example, each of electrode portions of a first conductor may overlap another portion, other than the central portion, of a corresponding one of individual electrodes, and each of electrode portions of a second conductor may overlap another portion, other than the confronting end portions) of corresponding adjacent individual electrodes in the conveying direction. For example, each of the electrode portions of the first conductor may overlap confronting end portions of corresponding adjacent individual electrodes in the conveying direction, and each of electrode portions of the second conductor may overlap a central portion of a corresponding one of the individual electrodes in the conveying direction.

The description has been made on the example in which the disclosure is applied to the inkjet head for ejecting ink from the nozzles. Nevertheless, in other embodiments or variations, for example, the disclosure may be applied to other liquid ejecting devices for ejecting liquid other than ink from nozzles or piezoelectric actuators to be used in other liquid ejecting devices other than the inkjet heads. Further, in other embodiments or variations, for example, the disclosure may be applied to piezoelectric actuators to be used in devices other than the liquid ejecting devices.

What is claimed is:

1. A piezoelectric actuator comprising:
   a first piezoelectric layer and a second piezoelectric layer joined to each other at a surface of the first piezoelectric layer;
   individual electrodes disposed on the first piezoelectric layer;
   a first conductor spaced apart from the individual electrodes in a direction orthogonal to the surface of the first piezoelectric layer,
   the first conductor including:
   electrode portions each overlapping a first portion of a corresponding one of the individual electrodes; and
   a connecting portion connecting at least two of the electrode portions to each other,
   wherein the connecting portion extends from a first end portion to a second end portion in a second direction transverse to the direction, and wherein the first conductor further comprises a second connecting portion connected to a first end portion of the connecting portion, wherein the first conductor further comprises a third connecting portion connecting at least two of the electrode portions to each other, the third connecting portion extending in the second direction from a first end portion to a second end portion of the third connecting portion, the third connecting portion being spaced from the connecting portion in a third direction transverse to the direction and the second direction, wherein the second connecting portion is connected to the first end portion of the connecting portion and the first end portion of the third connecting portion;
   an auxiliary electrode, and
   wherein the auxiliary electrode is connected to the connecting portion, overlaps the connecting portion, and is spaced apart from the first conductor in the direction, and wherein the auxiliary electrode connects to at least one of the first end portion and the second end portion of the connecting portion; and
   a second auxiliary electrode connected to at least one of the first end portion and the second end portion of the third connecting portion.

2. The piezoelectric actuator according to claim 1,
   wherein the first conductor is maintained at a first potential,
   the piezoelectric actuator further comprising a second conductor maintained at a second potential different from the first potential, the second conductor spaced apart from the individual electrodes in the direction.

3. The piezoelectric actuator according to claim 1,
   wherein the second piezoelectric layer includes a through hole, and
   wherein the connecting portion and the auxiliary electrode are connected via the through hole of the second piezoelectric layer.

4. The piezoelectric actuator according to claim 3,
   wherein the connecting portion includes a first end portion and a second end portion,
   wherein the second piezoelectric layer includes a second through hole,
   wherein the through hole is located at the first end portion,
   wherein the second through hole is located at the second end portion, and wherein the connecting portion is connected to the auxiliary electrode via the through hole and the second through hole.

5. The piezoelectric actuator according to claim 1,
wherein the electrode portions are aligned in rows, the rows including a first row of electrode portions and a second row of electrode portions, the first row and the second row being spaced apart in the third direction,
wherein the connecting portion connects the first row of electrode portions to each other, and
wherein the third connecting portion connects the second row of electrode portions to each other.

6. The piezoelectric actuator according to claim 1,
wherein the auxiliary electrode entirely overlaps the connecting portion.

7. The piezoelectric actuator according to claim 1,
wherein the auxiliary electrode extends beyond an end portion of the connecting portion.

8. The piezoelectric actuator according to claim 1,
wherein the individual electrodes are disposed on a first surface of the first piezoelectric layer,
wherein the first conductor is disposed on a second surface of the first piezoelectric layer,
wherein the second surface of the first piezoelectric layer is opposite to the first surface of the first piezoelectric layer and joined to a first surface of the second piezoelectric layer,
wherein the auxiliary electrode is disposed on a second surface of the second piezoelectric layer opposite to the first surface of the second piezoelectric layer.

9. A piezoelectric actuator comprising:
a first piezoelectric layer and a second piezoelectric layer joined to each other at a surface of the first piezoelectric layer wherein the first piezoelectric layer includes a through hole extending to the first conductor;
individual electrodes disposed on the first piezoelectric layer;
a first conductor spaced apart from the individual electrodes in a direction orthogonal to the surface of the first piezoelectric layer,
the first conductor including:
electrode portions each overlapping a first portion of a corresponding one of the individual electrodes; and
a connecting portion connecting at least two of the electrode portions to each other, wherein the first conductor further comprises a second connecting portion connecting at least two of the electrode portions to each other, wherein a shortest distance between the through hole and the connecting portion is larger than a shortest distance between the through hole and the second connecting portion; and
an auxiliary electrode,
wherein the auxiliary electrode is connected to the connecting portion, overlaps the connecting portion, and is spaced apart from the first conductor in the direction;
wherein the connecting portion extends in a second direction transverse to the direction;
wherein the second connecting portion extends in the second direction;
wherein the first conductor further comprises a third connecting portion connected to the connecting portion and the second connecting portion;
wherein the second connecting portion is spaced from the connecting portion in a third direction transverse to the direction and the second direction.

10. The piezoelectric actuator according to claim 9,
wherein the first piezoelectric layer includes a second through hole,
wherein the third connecting portion extends from a first end portion to a second end portion,
wherein the through hole is located at the first end portion of the third connecting portion,
wherein the second through hole is located at the second end portion of the third connecting portion,
wherein the first conductor further comprises a fourth connecting portion connecting at least two of the electrode portions to each other and extending in the second direction;
wherein the third connecting portion is connected to the fourth connecting portion;
wherein the fourth connecting portion is spaced from the connecting portion in the third direction,
wherein the connecting portion is disposed between the second connecting portion and the fourth connecting portion in the third direction.

11. A piezoelectric actuator comprising:
a first piezoelectric layer and a second piezoelectric layer joined to each other at a surface of the first piezoelectric layer;
individual electrodes disposed on the first piezoelectric layer;
a first conductor maintained at a first potential, the first conductor spaced apart from the individual electrodes in a direction orthogonal to the surface of the first piezoelectric layer,
the first conductor including:
electrode portions each overlapping a first portion of a corresponding one of the individual electrodes;
a connecting portion connecting at least two of the electrode portions to each other;
a second conductor maintained at a second potential different from the first potential, the second conductor spaced apart from the individual electrodes in the direction; and
an auxiliary electrode,
wherein the auxiliary electrode overlaps the connecting portion, is spaced apart from the first conductor in the direction, and is maintained at a third potential different from the second potential and the first potential.

12. The piezoelectric actuator according to claim 11,
wherein the auxiliary electrode and the second conductor are disposed on the same surface of the second piezoelectric layer.

13. A piezoelectric actuator comprising:
a first piezoelectric layer and a second piezoelectric layer joined to each other at a surface of the first piezoelectric layer;
individual electrodes disposed on the first piezoelectric layer;
a first conductor maintained at a first potential, the first conductor spaced apart from the individual electrodes in a direction orthogonal to the surface of the first piezoelectric layer,
the first conductor including:
electrode portions each overlapping a first portion of a corresponding one of the individual electrodes; and
a connecting portion connecting at least two of the electrode portions to each other,
a second conductor maintained a second potential different from the first potential, the second conductor spaced apart from the individual electrodes in the direction;

and an auxiliary electrode,
wherein the auxiliary electrode is connected to the second conductor, overlaps the connecting portion, and is spaced apart from the first conductor and the second conductor in the direction.

14. The piezoelectric actuator according to claim 13, further comprising an insulating layer joined to the second piezoelectric layer,
wherein the auxiliary electrode is disposed on the insulating layer.

15. The piezoelectric actuator according to claim 13, wherein the first conductor is thinner than the second conductor and the auxiliary electrode.

16. The piezoelectric actuator according to claim 13, wherein the first conductor and the auxiliary electrode are thinner than the second conductor.

17. The piezoelectric actuator according to claim 16, wherein a thickness of the second conductor is equal to a sum of a thickness of the first conductor and a thickness of the auxiliary electrode.

18. A liquid ejection device comprising:
a piezoelectric actuator including:
  a first piezoelectric layer and a second piezoelectric layer joined to each other at a surface of the first piezoelectric layer;
  individual electrodes disposed on the first piezoelectric layer;
  a first conductor spaced apart from the individual electrodes in a direction orthogonal to the surface of the first piezoelectric layer, the first conductor including:
    electrode portions each overlapping a first portion of a corresponding one of the individual electrodes; and
    a connecting portion connecting at least two of the electrode portions to each other,
  wherein the connecting portion extends from a first end portion to a second end portion in a second direction transverse to the direction, and wherein the first conductor further comprises a second connecting portion connected to a first end portion of the connecting portion, wherein the first conductor further comprises a third connecting portion connecting at least two of the electrode portions to each other, the third connecting portion extending in the second direction from a first end portion to a second end portion of the third connecting portion, the third connecting portion being spaced from the connecting portion in a third direction transverse to the direction and the second direction, wherein the second connecting portion is connected to the first end portion of the connecting portion and the first end portion of the third connecting portion;
  an auxiliary electrode, and
  wherein the auxiliary electrode is connected to the connecting portion, overlaps the connecting portion, and is spaced apart from the first conductor in the direction, and wherein the auxiliary electrode connects to at least one of the first end portion and the second end portion of the connecting portion; and
    a second auxiliary electrode connected to at least one of the first end portion and the second end portion of the third connecting portion,
  and
a channel unit including:
  a nozzle; and
  a pressure chamber in communication with the nozzle,
wherein the piezoelectric actuator is configured to increase and decrease a volume of the pressure chamber, and
wherein the auxiliary electrode overlaps at least a portion of the pressure chamber in the direction.

19. The liquid ejection device according to claim 18:
wherein the auxiliary electrode does not overlap the electrode portions.

20. A piezoelectric actuator comprising:
a first piezoelectric layer and a second piezoelectric layer joined to each other at a surface of the first piezoelectric layer;
individual electrodes disposed on the first piezoelectric layer;
a first conductor spaced apart from the individual electrodes in a first direction orthogonal to the surface of the first piezoelectric layer,
the first conductor including:
  electrode portions each overlapping a first portion of a corresponding one of the individual electrodes; and
  a connecting portion connecting at least two of the electrode portions to each other;
an auxiliary electrode,
wherein the auxiliary electrode is connected to the connecting portion, overlaps the connecting portion, and is spaced apart from the first conductor in the first direction; and
a second conductor spaced apart from the individual electrodes in the first direction, wherein the auxiliary electrode is spaced apart from the second conductor in a second direction on a second surface of the second piezoelectric layer, the second surface of the second piezoelectric layer opposite to a first surface of the second piezoelectric layer, the first surface of the second piezoelectric layer joined to the surface of the first piezoelectric layer, and wherein the second direction is transverse to the first direction.

21. The piezoelectric actuator according to claim 20, wherein the first conductor is maintained at a first potential, and wherein the second conductor is maintained at a second potential different from the first potential.

22. The piezoelectric actuator according to claim 20, wherein the second piezoelectric layer includes a through hole, and
wherein the connecting portion and the auxiliary electrode are connected via the through hole of the second piezoelectric layer.

23. The piezoelectric actuator according to claim 20, wherein the connecting portion extends from a first end portion to a second end portion in a third direction transverse to the first direction;
wherein the auxiliary electrode connects to at least one of the first end portion and the second end portion of the connecting portion;
wherein the first conductor further comprises a second connecting portion connected to a first end portion of the connecting portion.

24. The piezoelectric actuator according to claim 20, wherein the first piezoelectric layer includes a through hole extending to the first conductor, and
wherein the first conductor further comprises a second connecting portion connecting at least two of the electrode portions to each other,
wherein a shortest distance between the through hole and the connecting portion is larger than a shortest distance between the through hole and the second connecting portion.

25. The piezoelectric actuator according to claim 20, wherein the auxiliary electrode entirely overlaps the connecting portion.

26. The piezoelectric actuator according to claim 20, wherein the auxiliary electrode extends beyond an end portion of the connecting portion.

27. The piezoelectric actuator according to claim 20, wherein the individual electrodes are disposed on a first surface of the first piezoelectric layer,
wherein the first conductor is disposed on a second surface of the first piezoelectric layer,
wherein the second surface of the first piezoelectric layer is opposite to the first surface of the first piezoelectric layer.

\* \* \* \* \*

UNITED STATES PATENT AND TRADEMARK OFFICE
CERTIFICATE OF CORRECTION

PATENT NO. : 10,468,583 B2
APPLICATION NO. : 15/881850
DATED : November 5, 2019
INVENTOR(S) : Keiji Kura Page 1 of 1

It is certified that error appears in the above-identified patent and that said Letters Patent is hereby corrected as shown below:

In the Claims

Column 23, Claim 9, Line 57 should read:
spaced apart from the first conductor in the direction;

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*